(12) United States Patent
Bruel

(10) Patent No.: US 9,528,196 B2
(45) Date of Patent: Dec. 27, 2016

(54) METHOD AND DEVICE FOR FABRICATING A LAYER IN SEMICONDUCTOR MATERIAL

(75) Inventor: Michel Bruel, Veurey-Voroize (FR)

(73) Assignee: Soitec, Bernin (FR)

( * ) Notice: Subject to any disclaimer, the term of this patent is extended or adjusted under 35 U.S.C. 154(b) by 334 days.

(21) Appl. No.: 14/131,295

(22) PCT Filed: Jul. 25, 2012

(86) PCT No.: PCT/EP2012/064633
§ 371 (c)(1),
(2), (4) Date: Jan. 7, 2014

(87) PCT Pub. No.: WO2013/014209
PCT Pub. Date: Jan. 31, 2013

(65) Prior Publication Data
US 2014/0158041 A1    Jun. 12, 2014

(30) Foreign Application Priority Data
Jul. 25, 2011  (FR) ...................................... 11 56770

(51) Int. Cl.
| C30B 11/14 | (2006.01) |
| C30B 19/10 | (2006.01) |
| H01L 21/02 | (2006.01) |
| C30B 19/00 | (2006.01) |
| C30B 29/06 | (2006.01) |

(Continued)

(52) U.S. Cl.
CPC ............... *C30B 19/10* (2013.01); *C30B 19/00* (2013.01); *C30B 19/062* (2013.01); *C30B 29/06* (2013.01); *C30B 29/08* (2013.01); *H01L 21/02532* (2013.01); *H01L 21/02625* (2013.01)

(58) Field of Classification Search
CPC ........... H01L 21/02; H01L 21/20; C30B 11/14
See application file for complete search history.

(56) References Cited

U.S. PATENT DOCUMENTS

| 4,368,083 A | 1/1983 | Bruel et al. |
| 4,370,176 A | 1/1983 | Bruel et al. |
(Continued)

FOREIGN PATENT DOCUMENTS

| EP | 851513 A2 | 7/1998 |
| JP | 10189924 A | 7/1998 |
(Continued)

OTHER PUBLICATIONS

Singapore Search Report and Written Opinion for Singapore Application No. 2014001077 dated Dec. 10, 2014, 21 pages.
(Continued)

*Primary Examiner* — Robert M Kunemund
(74) *Attorney, Agent, or Firm* — TraskBritt

(57) ABSTRACT

The invention concerns a method for fabricating a substrate in semiconductor material characterized in that it comprises the steps of: starting from a donor substrate in a first semiconductor material at an initial temperature, contacting a surface of the donor substrate with a bath of a second semiconductor material held in the liquid state at a temperature higher than the initial temperature, the second semiconductor material being chosen so that its melting point is equal to or lower than the melting point of the first semiconductor material, solidifying the bath material on the surface to thicken the donor substrate with a solidified layer. The invention also concerns a device for implementing the method.

22 Claims, 14 Drawing Sheets

(51) Int. Cl.
*C30B 29/08* (2006.01)
*C30B 19/06* (2006.01)

(56) References Cited

U.S. PATENT DOCUMENTS

| | | | |
|---|---|---|---|
| 4,452,644 A | 6/1984 | Bruel et al. |
| 4,508,056 A | 4/1985 | Bruel et al. |
| 4,527,044 A | 7/1985 | Bruel et al. |
| 4,536,657 A | 8/1985 | Bruel |
| 4,564,763 A | 1/1986 | Bruel et al. |
| 4,585,945 A | 4/1986 | Bruel et al. |
| 4,704,302 A | 11/1987 | Bruel et al. |
| 5,167,758 A | 12/1992 | Maeda et al. |
| 5,374,564 A | 12/1994 | Bruel |
| 5,494,835 A | 2/1996 | Bruel |
| 5,559,043 A | 9/1996 | Bruel |
| 5,661,333 A | 8/1997 | Bruel et al. |
| 5,714,395 A | 2/1998 | Bruel |
| 5,804,086 A | 9/1998 | Bruel |
| 5,863,830 A | 1/1999 | Bruel et al. |
| 5,985,688 A | 11/1999 | Bruel |
| 5,993,677 A | 11/1999 | Bliasse et al. |
| 6,020,252 A | 2/2000 | Aspar et al. |
| 6,059,877 A | 5/2000 | Bruel |
| 6,103,597 A | 8/2000 | Aspar et al. |
| 6,159,323 A | 12/2000 | Joly et al. |
| 6,190,937 B1 | 2/2001 | Nakagawa et al. |
| 6,190,998 B1 | 2/2001 | Bruel et al. |
| 6,225,190 B1 | 5/2001 | Bruel et al. |
| 6,225,192 B1 | 5/2001 | Aspar et al. |
| 6,261,928 B1 | 7/2001 | Bruel |
| 6,303,468 B1 | 10/2001 | Aspar et al. |
| 6,316,333 B1 | 11/2001 | Bruel et al. |
| 6,335,258 B1 | 1/2002 | Aspar et al. |
| 6,362,077 B1 | 3/2002 | Aspar et al. |
| 6,465,327 B1 | 10/2002 | Aspar et al. |
| 6,558,998 B2 | 5/2003 | Belleville et al. |
| 6,730,208 B1 | 5/2004 | Bruel |
| 6,756,286 B1 | 6/2004 | Moriceau et al. |
| 6,808,967 B1 | 10/2004 | Aspar et al. |
| 6,809,009 B2 | 10/2004 | Aspar et al. |
| 6,809,044 B1 | 10/2004 | Aspar et al. |
| 6,876,787 B2 | 4/2005 | Bruel et al. |
| 6,891,990 B2 | 5/2005 | Bruel |
| 6,946,365 B2 | 9/2005 | Aspar et al. |
| 6,993,215 B2 | 1/2006 | Bruel |
| 7,067,396 B2 | 6/2006 | Aspar et al. |
| RE39,484 E | 2/2007 | Bruel |
| 7,229,899 B2 | 6/2007 | Moriceau et al. |
| 7,300,853 B2 | 11/2007 | Joly et al. |
| 7,332,030 B2 | 2/2008 | Bruel |
| 7,368,030 B2 | 5/2008 | Jaussaud et al. |
| 7,435,614 B2 | 10/2008 | Bruel |
| 7,498,234 B2 | 3/2009 | Aspar et al. |
| 7,846,816 B2 | 12/2010 | Bruel |
| 7,883,994 B2 | 2/2011 | Moriceau et al. |
| 8,062,564 B2 | 11/2011 | Bruel |
| 8,101,503 B2 | 1/2012 | Aspar et al. |
| 8,324,530 B2 | 12/2012 | Bruel |
| 8,420,506 B2 | 4/2013 | Bruel |
| 8,470,712 B2 | 6/2013 | Moriceau et al. |
| 8,475,693 B2 | 7/2013 | Bruel et al. |
| 8,492,877 B2 | 7/2013 | Bruel |
| 8,563,399 B2 | 10/2013 | Bruel |
| 2002/0061632 A1 | 5/2002 | Ukiyo et al. |
| 2002/0094668 A1 | 7/2002 | Aspar et al. |
| 2003/0047289 A1 | 3/2003 | Jaussaud et al. |
| 2004/0126051 A1 | 7/2004 | Bruel |
| 2009/0311477 A1 | 12/2009 | Aspar et al. |
| 2010/0288741 A1 | 11/2010 | Bruel |
| 2010/0290946 A1 | 11/2010 | Cook et al. |
| 2011/0101281 A1 | 5/2011 | Cook et al. |
| 2011/0247549 A1 | 10/2011 | Sachs et al. |
| 2011/0250416 A1 | 10/2011 | Bruel et al. |
| 2011/0293254 A1 | 12/2011 | Bruel |
| 2011/0315664 A1 | 12/2011 | Bruel |
| 2012/0199953 A1 | 8/2012 | Bruel |
| 2013/0072009 A1 | 3/2013 | Bruel |
| 2013/0154065 A1 | 6/2013 | Bruel |

FOREIGN PATENT DOCUMENTS

| | | |
|---|---|---|
| JP | 20010203340 A | 1/2001 |
| JP | 20020141327 A | 5/2002 |
| JP | 20020184709 A | 6/2002 |
| JP | 20030292398 A | 10/2003 |
| JP | 20050277186 A | 10/2005 |
| JP | 20070035834 A | 2/2007 |
| JP | 2011513974 A | 4/2011 |
| JP | 2012519135 A | 8/2012 |
| JP | 2012519650 A | 8/2012 |
| JP | 2012526723 A | 11/2012 |
| WO | 2009104049 A1 | 8/2009 |
| WO | 2010104838 A1 | 9/2010 |

OTHER PUBLICATIONS

International Written Opinion for International Application No. PCT/EP2012/064633 dated Jan. 11, 2013, 10 pages.
International Preliminary Report on Patentability for International Application No. PCT/EP2012/064633 dated Jan. 28, 2014, 11 pages.
International Search Report for International Application No. PCT/EP2012/064633 dated Jan. 11, 2013, 6 pages.
Japanese Office Action for Japanese Application No. P2014-522090 dated Mar. 15, 2016, 11 pages.

Liquid Si / substrate capacitance

Variation capacitance as a function of X

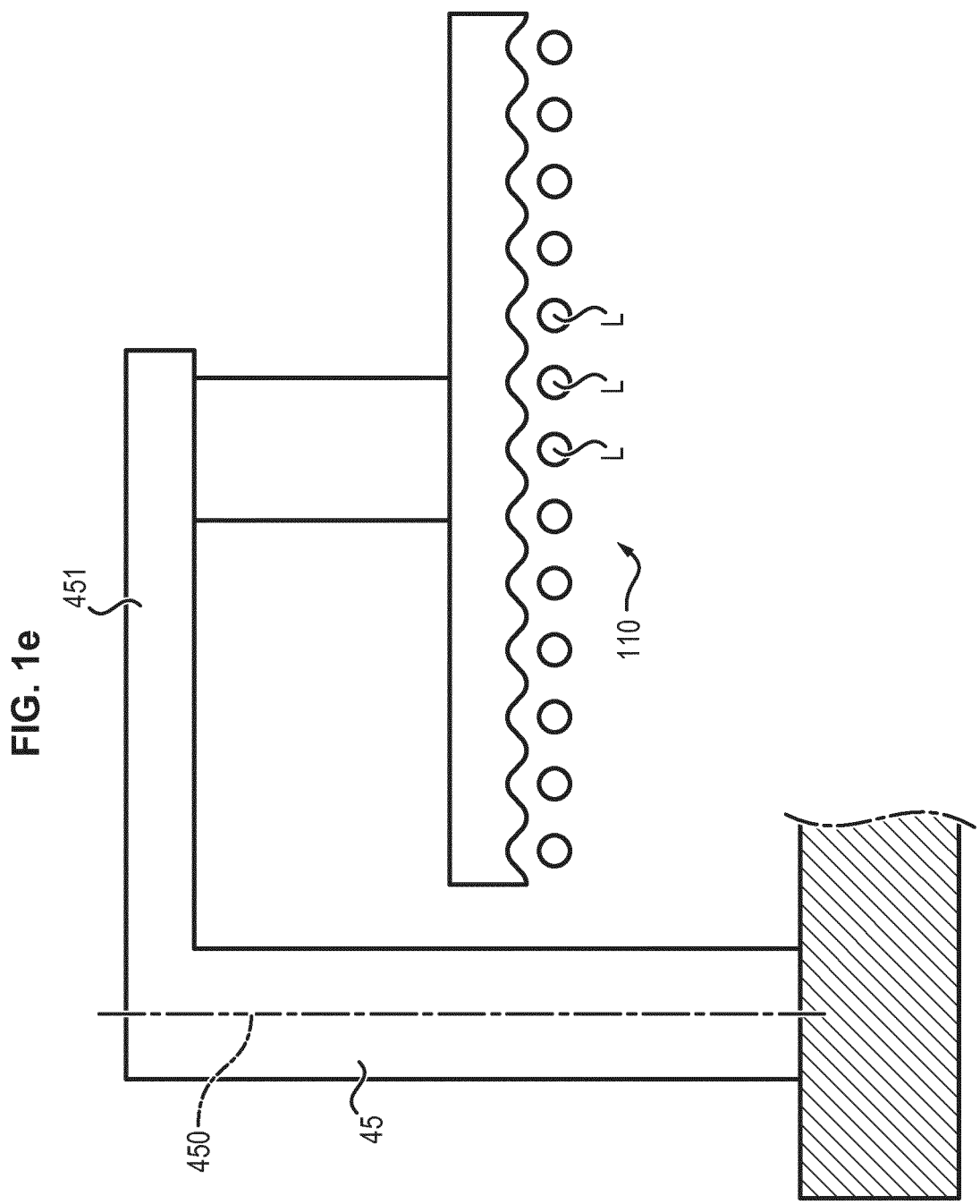

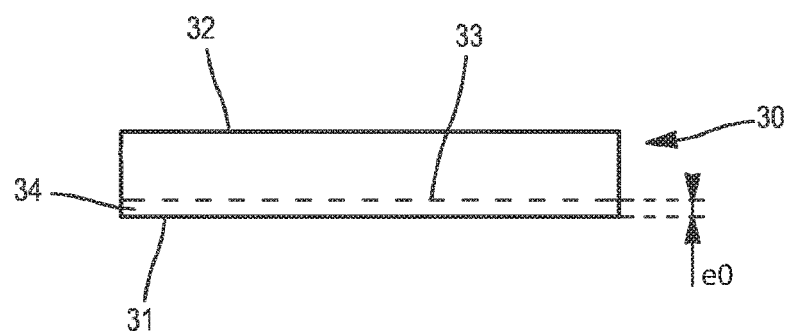
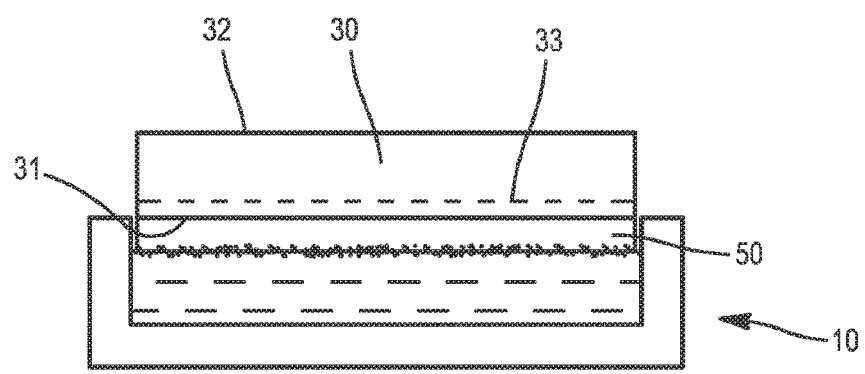

Epitaxial growth / substrate in inclined vs. liquid surface

Principle of wave soldering

METHOD AND DEVICE FOR FABRICATING A LAYER IN SEMICONDUCTOR MATERIAL

CROSS-REFERENCE TO RELATED APPLICATIONS

This application is a national phase entry under 35 U.S.C. §371 of International Patent Application PCT/EP2012/064633, filed Jul. 25, 2012, designating the United States of America and published in English as International Patent Publication WO 2013/014209 A1 on Jan. 31, 2013, which claims the benefit under Article 8 of the Patent Cooperation Treaty and under 35 U.S.C. §119(e) to French Patent Application Ser No. 1156770 filed Jul. 25, 2011, the disclosure of each of which is hereby incorporated herein in its entirety by this reference.

FIELD OF THE INVENTION

The present invention concerns a method for fabricating substrates in semiconductor material. The invention also applies to the fabrication of substrates in silicon, germanium or silicon-germanium compounds, this list not being limiting.

The invention further concerns a device for fabricating semiconductor substrates.

BACKGROUND OF THE INVENTION

Different methods exist for fabricating semiconductor substrates. These substrates are generally in the form of wafers that may be disc-shaped (e.g., with a diameter of 200 or 300 mm), or a different shape.

The choice of fabrication method generally depends on the type of semiconductor material, on the intended application and on economic constraints.

For example, to obtain silicon substrates intended for the fabrication of photovoltaic cells, it is possible to use a re-solidification method of molten silicon to obtain so-called polycrystalline or multi-crystalline silicon having coarse particles with a preferred direction of orientation. With this method, it is not possible to obtain substrates in single-crystalline material, although it is generally desired to have single-crystalline material for microelectronic applications.

Additionally, this method is not adapted for obtaining a substrate from a donor substrate in which a weakened zone has been fainted.

It may effectively be desired, for some applications, to form a substrate in semiconductor material of controlled thickness and quality, and comprising a weakened zone in the thickness of the substrate at a depth that is also controlled.

In this text, by "weakened zone" is meant a region that extends underneath a main face of the substrate (for a disc, underneath one of the faces of the disc) and parallel to this face, at a constant depth in the thickness of the substrate and that, under the action heating optionally combined with mechanical stress, will lead to the detachment of the substrate at this region.

The weakened zone may typically be formed by inserting ionic species, e.g., hydrogen and/or helium, and/or rare gases into the substrate, to generate microcavities therein forming the weakened zone. This inserting can be achieved by implantation or even by other means such as species diffusion. One known example using the insertion of species to create a weakened zone is the SMART CUT® process. The microcavities, under the effect of a heat budget, can then set up stresses in the substrate that will lead to the detachment, alone or in combination with mechanical stresses applied to either side of the weakened zone.

One advantageous application of the invention is the fabrication of substrates comprising a weakened zone, allowing the detachment of a layer of semiconductor material. In this manner, the invention allows the forming of layers whose thickness can be controlled with great precision, even at low thickness values, e.g., of the order of 50 microns. With the invention, it is also possible to fabricate layers of semiconductor material, still of controlled thickness and possibly of very narrow thickness, in single-crystalline material of very good quality.

To prepare silicon substrates for application in microelectronics, it is known to use the Czochralsky pulling process, which allows the fabrication of ingots of single-crystal silicon.

Ingot pulling using the Czochralsky process may give rise to problems, in particular if the ingot is of large diameter (e.g., 300 mm or 450 mm). When it is desired to increase the diameter of the ingot and hence of the substrates derived therefrom, the extraction of the latent heat from solidification of the ingot becomes increasingly more difficult. This limits ingot pulling rates. In addition, it is likely to create non-homogeneities inside the ingot.

The two above-mentioned methods yield silicon ingots that must then be cut by sawing to obtain substrates. It is also generally necessary to treat the surfaces of these substrates.

These cutting and treating operations are relatively costly.

In addition, they have the disadvantage of consuming a significant part of the ingot mass, and they can only lead with difficulty—even not at all—to the obtaining of thin substrates.

For example, by sawing an ingot, it is not possible to obtain thin substrates having a thickness of 50 microns, for example. Yet, for some applications, such as the manufacture of photovoltaic cells, a narrow substrate thickness may be desired.

Obtaining layers of single-crystal material by epitaxial growth on a single-crystal starting substrate by means of a vacuum deposit method, for example, of CVD type, or using a molecular beam epitaxy method (MBE) is also known. Under well-controlled conditions, a method for fabricating layers by epitaxial growth can produce material of good quality. Limitations of this type of method follow from the slowness of the process and its cost.

DISCLOSURE

It is one objective of the invention to produce semiconductor substrates, both of narrow thickness (e.g., 50 microns) and of larger thickness (e.g., from 500 to 1000 microns), and having large lateral dimensions (e.g., a diameter of 300 mm or even larger) by avoiding or limiting the afore-mentioned shortcomings.

To reach the objective set forth above, according to a first aspect, the invention proposes a method for fabricating a substrate in semiconductor material characterized in that it comprises the steps of:

Starting from a donor substrate in a first semiconductor material at an initial temperature;

Contacting one surface of the donor substrate with a bath of a second semiconductor material held in the liquid state at a temperature higher than the initial temperature, the second semiconductor material being chosen so that its melting point is equal to or lower than the melting point of the first semiconductor material;

Solidifying the bath material on the surface to thicken the donor substrate with a solidified layer.

Preferred, but non-limiting aspects of the method are the following:

the first semiconductor material is silicon, germanium or silicon-germanium, the second semiconductor material is silicon, germanium or silicon-germanium, the bath is contained in a vessel whose depth corresponds to the desired thickness for the solidified layer, The method, according to one of the following claims, is characterized in that the material of the bath is overheated, by a few degrees or tens of degrees, compared to a heating that would only be calibrated to maintain the material of the bath in a liquid state, the method is carried out in a reducing atmosphere, the donor substrate is preheated to an initial temperature, before it is brought into contact with the liquid surface, the preheating is carried out at a temperature at least equal to the temperature at which it is possible to carry out an epitaxy having the desired quality, the donor substrate comprises a weakened zone and the temperature of preheating allows, while avoiding the apparition of blistering, a duration of preheating of several seconds, the donor substrate is brought, from a starting state where it is at a starting temperature, into contact with the liquid material of the bath, within a time that is substantially of one second per 100° C. of difference between the starting temperature of the substrate and the desired initial temperature, the dynamics of the movement of the substrate toward the liquid surface is controlled to minimize the time spent by the substrate at a very short distance (less than 1 mm) from the liquid surface, the rate of approach of the liquid surface by the substrate is a decreasing function of the inverse of the distance between the substrate and the liquid surface, a chemical treatment is applied just before the contacting sequence with the liquid phase, the chemical treatment is a deoxidation using dilute HF, during the contacting of the surface of the donor substrate with the liquid, at every point of the surface of the donor substrate, there is continuity of the sign of the local angle of entry of the local surface of the substrate with the liquid, the surface deformations of the donor substrate are measured so that, on the basis of these measurements, in every point of the surface of the substrate, a local contacting angle of the substrate with the liquid can be determined that will allow fulfilling the condition that during the contacting of the donor substrate surface with the liquid, at every point there is continuity of the sign of the local angle of entry of the local surface of the substrate with the liquid, a wave of liquid material is generated in the bath of the second semiconductor material held in the liquid state, and the wave comes in contact with the surface of the donor substrate, the rate of movement of the wave with respect to the surface of the substrate is of the order of a few centimeters per second, the donor substrate comprises a weakened zone formed by inserting atomic species into the thickness of the donor substrate, prior to implementing the method, a simulation is carried out to ensure that the heat received by the weakened zone will not produce any blistering of the donor substrate, the simulation is used to verify that the value of the integral:

$$I = \int_0^{t1} dt/D(Tz(t))$$

remains less than 1, where:

t1 =planned time length of the process,

D(Tz)=duration of exposure of the weakened zone to temperature Tz, which leads to blistering, and Tz(t)=temperature at the weakened zone at time t.

According to a second aspect, the invention also proposes a device for implementing a method such as mentioned above, and characterized in that it comprises:

A vessel to contain the liquid bath,

Heating means to bring the material of the bath to the liquid state and to hold it in this state.

Preferred, but non-limiting, aspects of this device are the following:

the heating means comprise lamps and the device comprises means for individual regulating of the power fed to each lamp of the heating means, the heating means are completed by an additional heating system, the additional heating system is an induction heating system located underneath the vessel, the device comprises:

Means for electrically insulating the donor substrate,

Means for measuring capacitance, the means having one electrode to be in contact with the back side of the substrate, and the other electrode to be in contact with the material of the bath, Means for varying inclination of the surface of the substrate with respect to the surface of the liquid bath, the device comprises processing means for determining the angle of inclination to be given to the substrate with respect to the surface of the liquid bath, the device comprises:

an arm system, a main jack system, attached below the aiiu system, a system of "fine" actuators, attached under the main jack system, the system of "fine" actuators carrying the donor substrate, The arm system allowing rapidly bringing the main jack system and the fine actuators and thus the substrate to above the liquid surface at a well-calibrated distance, for example, of a few mm, The main jack system being vertically movable with respect to the aim system, and allowing, after having been brought above the liquid surface by the arm system, lowering the center of the donor substrate down to the liquid surface at a programmed rate and with precision, The system of "fine" actuators allowing the angle of the surface of the donor substrate to be varied and thus allowing an adjustment of the orientation of the substrate with respect to the liquid surface.

BRIEF DESCRIPTION OF THE DRAWINGS

Other aspects of the invention are set forth in the following description given with reference to the appended drawings in which:

FIG. 1e is a schematic view of a heating structure that can be used in the invention;

FIG. 2 illustrates an example of a donor substrate that can be used in the invention;

FIG. 3 illustrates a donor substrate used in a device of the type shown in FIGS. 1a and 1b, to give rise to the solidifying of a layer in semiconductor material;

All of the drawings in these figures are schematic block illustrations that are not necessarily drawn to the scale of practical applications. In particular, the thicknesses of the substrates are not drawn to true scale.

DETAILED DESCRIPTION

The Manufacturing Device

Figure 1A:
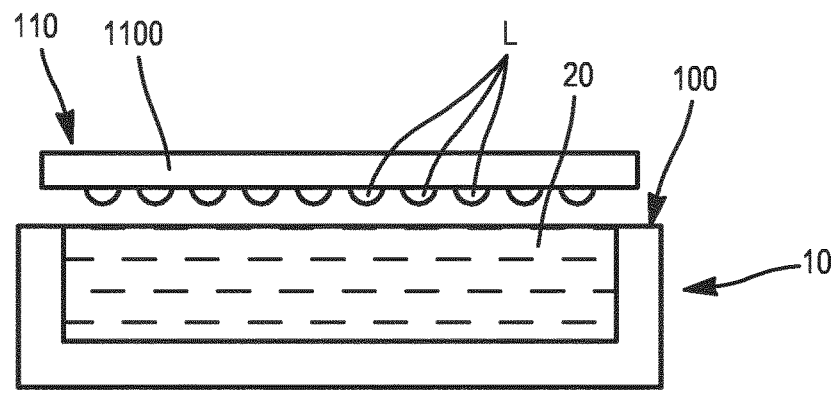
FIGS. 1a and 1b illustrate a device for fabricating a substrate in semiconductor material.

FIG. 1a schematically illustrates a device 10 for manufacturing a substrate in semiconductor material.

Figure 1B:
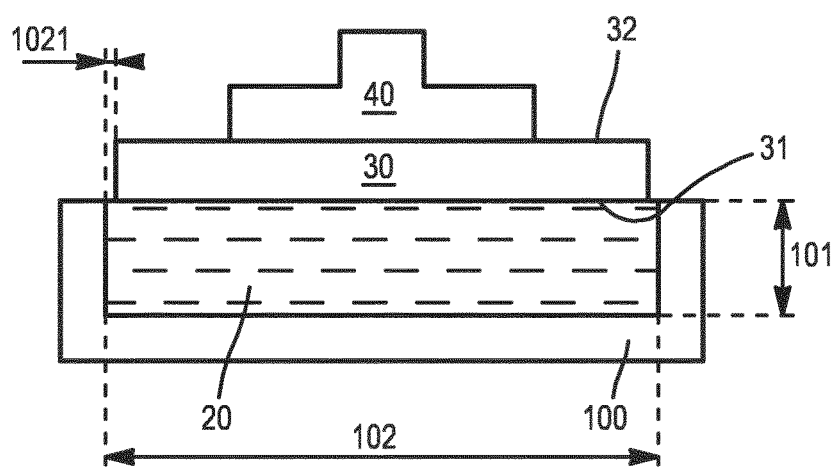

As will be explained below, the substrate is fabricated from an initial so-called donor substrate. The donor substrate 30 is schematically illustrated in FIG. 1b. It is specified that the "substrate," in the meaning of this text, is said to be "donor" since in one application of the invention, it comprises a weakened zone and may be subjected to a detachment operation to "donate" a layer of semiconductor material. The invention also covers the case in which this "donor" substrate does not comprise a weakened zone.

The device 10 comprises a vessel 100, which is adapted to contain a bath of molten semiconductor material 20. This may be a ceramic vat, for example. In the remainder of this text, with respect to reference 20, the terms bath or material of this bath in the liquid state will be used indifferently.

The vessel 100 is preferably made in a heat-insulating material, e.g., refractory material.

The vessel 100 is associated with heating means 110, which may assume different forms and are illustrated in FIG. 1a in the form of an assembly 110 of infrared lamps L placed above the surface of the bath. In this configuration, means are provided for bringing the heating means opposite the surface of the bath, and for rapid withdrawal thereof.

The lamps L in the example illustrated in FIG. 1a are heating lamps of infrared radiation type. These lamps—or any other heating means that can be controlled—are preferably arranged, in the heating position of the bath 20 as illustrated in FIG. 1a, in a region 1100 that extends opposite the entire surface of the bath, and only this surface. It is effectively preferable to position the heating means 110 so that they only heat the liquid material of the bath 20 and not the vessel 100.

FIG. 1e shows a structure 45 carrying, through an arm 451 that can pivot around the axis 450, such an assembly 110 of lamps L. It can be used to bring the lamps L on top of the bath 20.

The heating means 110 allow the material of the bath 20 to be brought to the liquid state and to hold it thereat for as long as is desired. For this purpose, the powering of each lamp of the heating means 110 is regulated individually so as to ensure that the material of the bath 20 is in the liquid state at every point and at a homogeneous temperature.

The heating means can optionally be completed by an additional heating system, for example, a high frequency induction system, which may be located underneath the vessel. The additional system (not illustrated in the figures) can contribute toward holding the material of the bath 20 in the liquid state once it has reached melting point under the lamp heating system.

The vessel 100 is, therefore, filled with semiconductor material 20 in the liquid state. As will be seen, this material will solidify on the surface of the donor substrate to form a layer of solid material on this surface.

The donor substrate 30, from an overhead view (perpendicular to the view in FIG. 1b), has the desired shape for the substrate, or layer, to be fabricated. It may typically be a disc shape of desired diameter. It may also be a square, rectangle, hexagon, or other shape. The vessel 100, seen from overhead, has the same shape.

The depth 101 of the vessel 100 will define the thickness of the layer of solid material that will be formed on the surface 31 of the donor substrate 30.

This depth 101 is, therefore, chosen such that the thickness of contained liquid material is able to correspond to the desired thickness for this layer of solid material, i.e., the depth will be larger than the desired thickness for this layer of solid material by a quantity that takes into account the density differential between the liquid state of the bath material 20 and its solid state, and by an additional amount (for example, of the order of 20% of the thickness) to ensure lateral confinement without the risk of overspill.

This provision is made to prevent the effect that could result from slight penetration of the surface of the donor substrate 30 into the liquid, namely, an elevation of the free surface of the liquid around the outside and/or oscillations of the free surface of the liquid under the effect of the contacting with the donor substrate 30.

The lateral dimensions of the vessel 100—illustrated by dimension 102 in FIG. 1b—are chosen to be equal to the desired lateral dimensions for this layer of solid material, increased by a clearance 1021 of the order of 1% of the lateral dimensions to allow for shrinkage of the substrate 30 and of the layer that will solidify thereupon under good conditions. For a desired disc-shape of the layer of solid material, the dimension 102 is a diameter.

General Presentation of the Method

FIG. 1b illustrates the donor substrate 30 that has been brought into contact with the liquid surface 20, immediately after the heating means 110 have been switched off (and removed if they were arranged opposite the surface of the bath 20).

In general, the invention proposes placing in contact a main face 31 of the donor substrate 30 with the surface of the liquid bath of semiconductor material 20, to enable this material to solidify by epitaxy on the surface 31 and hence a layer of semiconductor material thereupon.

Prior to this contacting, the donor substrate 30 was at ambient temperature (of the order of 20° C. to 25° C.). Alternatively, it had been pre-heated. In either case, at the time of initial contacting of the donor substrate 30 with the liquid surface, the temperature of the donor substrate 30 is preferably lower than the temperature of the liquid.

Metrology and Actuation

Knowledge of the distance between the donor substrate and the liquid surface, and of the orientation of the surface of the donor substrate relative to the liquid surface, allows precise control over the implementation of the invention.

With this knowledge, it is possible to control the values of these parameters and to subject them to predetermined time function laws.

To measure the distance between the donor substrate and the liquid, according to one aspect of the invention, it is possible to measure the electric capacitance between the surface of the substrate and the surface of the liquid.

To do so, it is possible to proceed as follows.

The donor substrate is electrically insulated and its back face (opposite the face in contact with the liquid) is in contact with one of the two electrodes of a measuring device to measure capacitance.

The liquid bath may:
either be contained in an insulated, electrically conductive vessel and the other electrode of the capacitance measuring device is then in contact with the vessel,
or contained in a non-conductive vessel and the other electrode of the measuring device is then installed directly in contact with the liquid material.

Figure 1C:
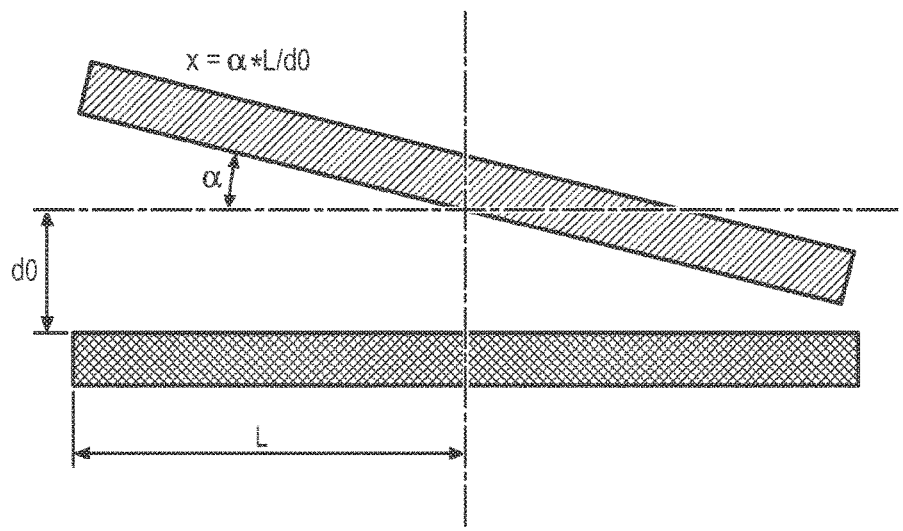
FIG. 1c is a schematic illustration of the electrical capacitance formed by a donor substrate and the surface of a bath of liquid material.
Figure 1D:
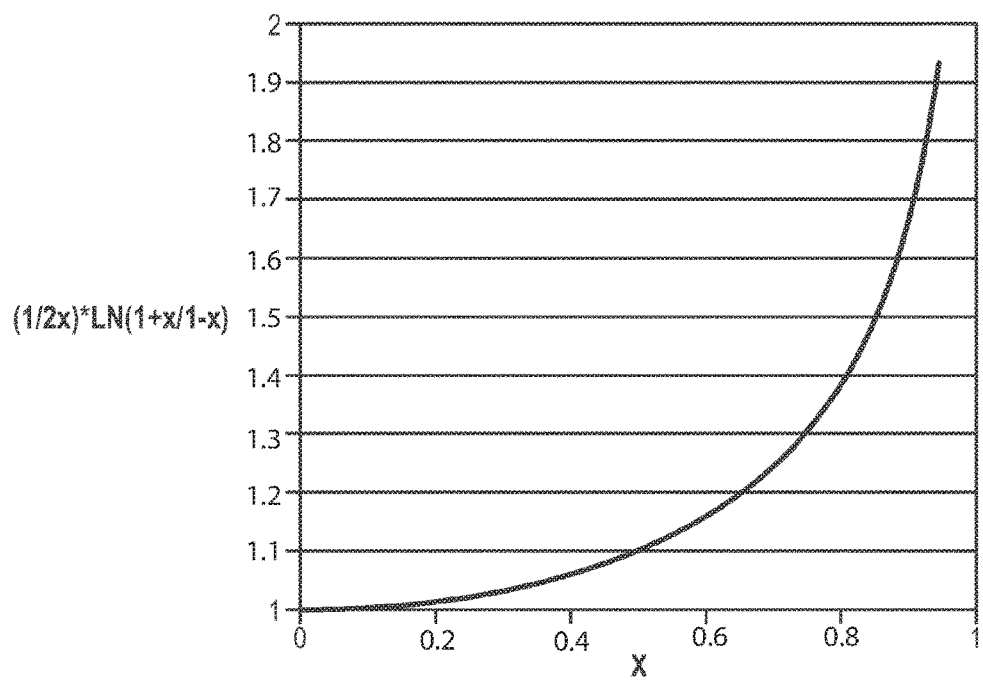
FIG. 1d illustrates the variation in the capacitance modeled in FIG. 1c.

As schematically illustrated in FIG. 1c, the capacitance formed by the substrate and the liquid surface is a planar capacitance, whose value can be estimated by:

$$C = \epsilon 0 * S / d$$

where:
d is the distance between the surface of the substrate and the surface of the liquid,
S is the surface of the substrate facing the liquid,
$\epsilon 0 = 10 \times E-9/36*\Pi$ In the strict sense, this result is accurate when the two surfaces (of the substrate and of the liquid) are strictly parallel.

When these two surfaces lie at an angle to each other at an angle α (this angle should remain small enough so that the first order geometrical approximation $\sin\alpha = \tan\alpha = \alpha$ is true—preferably this angle shall be smaller than 5 degrees) capacitance is expressed as:

$$C = (\epsilon 0 * S/d0) * (d0/2L\alpha) * \text{Log}((1 + \alpha L/d0)/(1 - \alpha L))$$

$$= C0 * (d0/2\alpha L) * \text{Log}((1 + \alpha L/d0)/(1 - \alpha L/dO))$$

where:
L is the opposite-facing semi-width following the angle (see FIG. 1c),
d0 is the mean value of the distance between the two surfaces.

If it is written $x = \alpha L/d0$ (x represents the ratio of clearance at the end over the mean distance), the expression becomes:

$$C/C0 = (\tfrac{1}{2}x) * \text{Log}((1+x)/(1-x)).$$

FIG. 1 d gives an overview of this function (evidently x is limited to values strictly lower than 1).

Using these measurements, causing a to vary over time, i.e., by causing the substrate to oscillate around a central point and by measuring the variation in capacitance over time (preferably using methods of synchronous detection type), it is possible to detect the horizontal position and to choose any desired tilt angle.

Figure 1F:
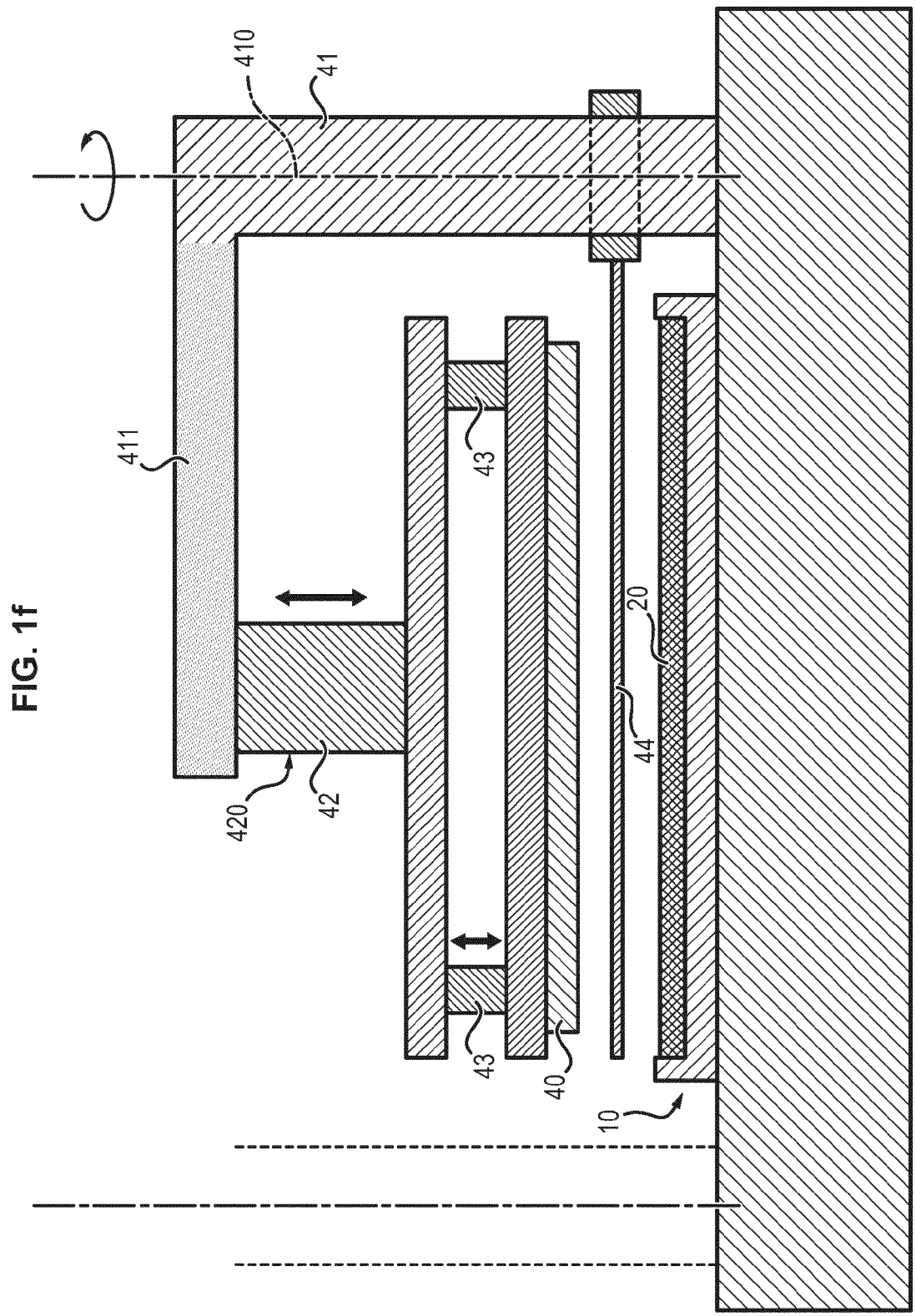
FIG. 1f illustrates one embodiment of the device according to the invention.

With regard now to the actuating and control over the distance and orientation of the substrate in relation to the liquid surface:

In one embodiment schematically illustrated in FIGS. 1e and 1f, the chuck, typically a vacuum chuck 40, supports the donor substrate 30.

This chuck 40 is connected to three systems of different means, and it can be moved by each of these systems:
an arm system 41,
a main jack system 42, attached below the arm system 41,
a system 43 of "fine" actuators, attached under the main jack system 42, the set 43 of "fine" actuators carrying the chuck 40 and the substrate 30.

The arm system 41, comprising an arm 411, allows rapidly bringing the main jack system 42 and the fine actuators 43 and, thus, the substrate 30, to above the liquid surface at a well-calibrated distance, for example, of a few mm.

This movement of bringing the main jack system 42 and the fine actuators 43 (and the substrate 30) above the liquid surface area can be made through rotation of the arm 411 around the rotation axis 410.

The main jack system 42, attached below the arm 411, is vertically movable with respect to the arm. The main jack system 42 can to this end be moved by a step motor with a differential screw-nut system 420.

It allows, after having been brought above the liquid surface by the arm 411, lowering the center of the substrate 30 down to the liquid surface at a programmed rate and with precision of the order of about ten microns.

System 43 of "fine" actuators (e.g., piezoelectric) allows the angle of the surface of the substrate 30 to be varied over two planes orthogonal to each other and orthogonal to the surface of the liquid. This system 43 thus allows a fine and final adjustment of the orientation of the substrate 30 with respect to the liquid surface.

These systems must be protected against a temperature rise on account of their residence time in a high temperature environment and exposed to intense heat radiation.

For this purpose, a cooling system whereby liquid is circulated as close as possible to the sensitive elements, is an efficient solution. Alternatively or in addition, a thermal shield 44 movably mounted with respect to the arm system can be used.

Variant: Preheating

In the following paragraphs, some indications are given for the case in which the donor substrate 30 has been preheated before it is brought into contact with the liquid surface.

Preheating of the donor substrate 30 allows the obtaining of conditions close to the optimal conditions for epitaxial growth, which will produce solidification of the semiconductor material 20, right after the first instants following the contacting of a main face 31 of the donor substrate 30 with the surface of the liquid bath of semiconductor material 20.

Therefore, the quality of epitaxial solidification is dependent upon $T_{initial}$, the initial temperature of the donor substrate 30 (at the time of contacting).

As soon as contact is made, solidification is initiated and the very first atoms of the semiconductor material 20 condensing to the solid state on the surface 31 of the donor substrate 30 are subjected to a temperature equal to $T_{initial}$.

The mobility of the atoms on this surface and hence their capability of organizing themselves into a regular network is dependent upon temperature. The choice of $T_{initial}$, therefore, has an influence on this aspect.

For a given material, preferably for $T_{initial}$, a temperature is chosen at least equal to the temperature at which quality epitaxy can be achieved corresponding to the epitaxy it is desired to obtain.

Preferably, for silicon, initial temperatures of the order of 400° C. to 600° C. are chosen. For other semiconductor materials, the choice of preheating temperature is to be adapted including taking into consideration the principles set forth below.

It is to be noted that for a donor substrate comprising a weakened zone, the choice of this initial temperature must, however, result from a trade-off between:
- a fairly high temperature to meet criteria of good initial growth,
- but the temperature must not be too high so that the phenomenon of blistering is not triggered, in particular, during the preheating phase.

Data obtained regarding the preheating at different temperatures of a silicon donor substrate comprising a weakened zone indicate that blistering may occur after a preheating time of 8 seconds at 520° C., and after a time of only 0.4 seconds at 600° C. This latter very short length of time makes preheating a difficult operation and it is preferable to target preheating temperatures in the range of 500° C., 550° C., so as to have the time to conduct preheating under good conditions.

In general, before the contacting with the liquid phase, the exposure of the donor substrate comprising a weakened zone to the preheating temperature must be carried out within a time Tpr that is sufficiently short so as not to lead to blistering.

Therefore, still with the example of a donor substrate of silicon, for an initial temperature of 300° C., the associated stress is relatively weak since the time needed for blistering at this temperature is several tens of minutes.

In practice, advantageously a preheating temperature is chosen that, as a function of the stresses related to the onset of blistering, allows a pre-heating time Tpr of several seconds, even several tens of seconds.

As set forth above, if the initial chosen temperature is 600° C., the time constraint is relatively high, since the onset time of blistering is of the order of one second, which raises practical problems with current materials.

The temperature of the donor substrate before contact with the liquid phase may also be controlled by the approach kinetics of the donor substrate toward the liquid phase.

In this respect, consideration is given to the fact that the heat exchanges between the donor substrate and the liquid surface are of three types: radiation, conduction and convection.

Concerning exchanges via radiation:

If the liquid phase is considered to be a black body at 1684K, it radiates a power density of the order of 46 W$cm^2$.

The variation in temperature of the donor substrate starting from ambient temperature is essentially governed, and for as long as its temperature remains relatively low compared with that of liquid silicon, by the following equations:

Received power density=46W/$cm^2$

Absorbed power density=g*46W/$cm^2$ where $\epsilon$ is the emissivity of the substrate $T(t)-TO=\epsilon*46*t/(Cp*e*p)$, where:

$\epsilon$ is a coefficient of apparent emissivity, t is the time during which the substrate receives the radiation, Cp is the heat capacity (0.7 J/g for silicon), e is the thickness of the donor substrate, p is the density (2.33 for silicon).

These considerations allow approximation of the reality of exchanges by radiation, although silicon is not a grey body in the sense that its emission spectrum cannot be deduced from the spectrum of the black body by a simple multiplication coefficient. The calculations presented here are, therefore, approximate evaluations and the coefficient $\epsilon$ is rather more a coefficient that can be termed apparent emissivity, since it depends, in particular, on the window of wavelengths in which the emission (or reception) takes place. Here, the window is the window of the emission of the black body at 1673K, which is centered on 1.7 μm (Wien's law: Lambda of max(m)=2.9*$E^{-3}$/1687), i.e., the emission maximum lies in a region of the spectrum in which non-doped silicon at ambient temperature is scarcely absorbent.

Emissivity $\epsilon$ is dependent on the temperature and doping of the donor substrate, strong substrate doping translating as emissivity less dependent on temperature and hence higher in the near-infrared.

If e=1 mm and assuming that the mean apparent emissivity between ambient and 600° C. is of the order of 0.35 (which corresponds to an order of magnitude of experimental results) and with heat insulation, it is found that the mean rate of temperature rise for the donor substrate when it approaches the bath of liquid material is 98° C. per second, i.e., in the order of 100° C./s.

This gives the order of magnitude of the temperature rise rates and, hence, of the required handling rapidity, i.e., of the order of 4 seconds for an initial temperature $T_{initial}$ 400° C., 6 seconds for $T_{initial}$=600° C.

In other words, when the donor substrate is brought, from a starting state where it is, e.g., at room temperature (around 20° C.), into contact with the liquid material of the bath, the move should be done within a time that is substantially of one second per 100° C. of difference between the starting temperature of the substrate (in this example, room temperature) and the desired initial temperature $T_{initial}$.

However, it is possible to slow this temperature rise to allow oneself some additional time to handle the donor substrate.

Three options can be used either alone or in combination:

Choosing a greater thickness of donor substrate. Within a typical range of dynamics and thickness (substrate thickness of a few tens of microns to a few millimeters), doubling the thickness would amount to dividing the temperature rise rate in half, Controlling the temperature of the substrate via good contact with the chuck by which it is supported, Using a mobile heat shield to protect the substrate against the radiation of the liquid silicon, positioning the substrate, removing the heat shield just the required number of seconds before contacting with the liquid phase.

With regard now to exchanges by conduction and convection:

Contrary to exchanges by radiation that are substantially independent of the distance between the substrate and the liquid surface, exchanges by conduction and convection do depend on this distance.

For exchanges by conduction:

If the atmosphere is air under standard atmospheric pressure, the conductivity of gas is 0.24 W/(m·K).

This translates as an exchange flow:

$F(W/cm^2)=0.024*\text{Delta}T/(\text{Distance in mm})$.

For a distance of 1 mm, where DeltaT=1400° C., F equals 33.6 W/cm².

Therefore, this exchange component, for a distance of 1 mm, is of the same order of magnitude as the exchange component by radiation.

As a result, the conduction component will predominate as soon as the distance between the substrate and the liquid surface becomes less than 1 mm.

Thus, one shall care, for the dynamics of the movement of the substrate toward the liquid surface, to minimize the time spent by the substrate at a very short distance (less than 1 mm) from the liquid surface.

This exchange component by conduction may be substantially reduced if the operation takes place under a controlled atmosphere at low pressure.

The exchange component by convection will generally be smaller than the conduction component for substrate-liquid distances of less than 1 cm.

Returning to the general description of the method of the invention, contacting is obtained by adequately positioning the donor substrate using chuck type means 40, which can be positioned on the back face of the donor substrate 30. The "back" face of the donor substrate 30 is the face 32 opposite the "front" surface 31, which is brought into contact with the liquid.

Prevention of Parasitic Species

In a particularly advantageous manner, provision is made for measures to prevent the trapping of parasitic species between the donor substrate and the liquid surface at the time of contacting.

Such parasitic species can effectively lead to defects in the re-solidified layer. These parasitic species can be:

the inclusion of foreign particles, faulty crystalline formation (dislocation, stacking defects, precipitates . . . ), or prevented epitaxial growth and homogeneous phase crystallization, leading to the formation of a polycrystalline substrate.

The potential parasitic species have three main origins. They may derive from:

defects on the surface of the liquid phase, a trapped gas phase, or species, defects or particles on the donor surface.

These three types of parasitic species will be examined below with indications for the prevention thereof. Each of these indications per se forms an advantageous provision associated with an identified benefit. These indications may also be used alone or in any combination.

First, concerning defects on the surface of the liquid phase:

The temperature of the liquid phase is not necessarily exactly the melting point of the second semiconductor material.

The temperature of the liquid phase may be higher than this melting point.

It is first to be noted that the heating-fusion system generally inputs more energy than is strictly necessary for simple fusion.

Also, in practice, it can be advantageous to overheat the material contained in the bath by a few degrees or tens of degrees, compared to a heating that would only be calibrated to maintain the material of the bath in a liquid state.

Such overheating aims at, during the time interval between the time when the heating is stopped and the donor substrate is brought into contact, preventing general or localized partial solidification in the vicinity of the liquid surface, or local or generalized undercooling should the temperature drop to below the melting point, or initiating homogeneous phase crystallization, for example.

It may also be desired to overheat the molten material by a few degrees or tens of degrees so that it is possible to transfer a sufficient amount of energy toward the donor substrate so as to liquefy a very thin surface layer thereof.

In this case, subsequent epitaxy would no longer take place starting from the initial interface between the donor substrate and the liquid layer, but from a "deep" layer (underneath a certain thickness) of the donor substrate. In this case, advantageously, a better quality liquid/solid interface is created (compared to the initial interface) and, therefore, the quality of the epitaxy is improved.

With regard now to the case of a trapped gas phase:

The origin of the trapped gas phase may be the gas environment (controlled or non-controlled atmosphere) in which the contact occurs between the donor substrate and the liquid phase. It is effectively possible that a gas phase may become trapped and is unable to evacuate fully from the space between the substrate and the liquid surface, before contacting.

To prevent this risk, it is possible to carry out the method under a controlled atmosphere, preferably a reducing atmosphere. This atmosphere can, in addition, be kept at low pressure.

It is also advantageously possible to control the dynamics of the approach of the substrate toward the liquid surface.

Indeed, as and when the space between the substrate and the liquid surface is reduced, the conductance (in its aerodynamic meaning, i.e., the ratio between the gaseous flux and the pressure difference between the substrate and the liquid surface) of this space is reduced, but increasingly rapidly (if one considers that the diminution of space is linear, the conductance shall decrease faster than a linear law), which reduces the relative amount of gas able to be expelled per unit of time.

It is, therefore, advantageous to provide that the rate of approach is a decreasing function of the inverse of the distance between the substrate and the liquid surface, such that the evacuation of gases occurs under good conditions.

When working under a controlled atmosphere, the choice of light gas species for the atmosphere ($H_2$, He), will also contribute toward this evacuation.

Finally, concerning species, defects or particles on the surface of the donor substrate:

To eliminate or at least strongly limit these problems, the surface condition of the donor substrate is advantageously prepared. To this end, a chemical treatment is applied just before the contacting sequence with the liquid phase.

The chemical treatment may be deoxidation, for example, using dilute HF to eliminate any possible protective oxide through which implantation may have been made (in this case, a donor substrate comprising a region weakened by implantation). RCA treatment (SC1+SC2) is then applied to the substrate to eliminate particle and metal contaminations.

Returning again to the general description of the method, after the initial contacting, the donor substrate 30 in one embodiment is held fixedly by the chuck means 40. The heating of the bath material at this stage is stopped or reduced in a controlled manner. In this position, the liquid semiconductor material 20 will progressively solidify on the surface 31 of the donor substrate 30. This solidification occurs by epitaxial growth.

Quality of Epitaxy

In another embodiment, it is possible to fine-tune the consideration given to phenomena influencing solidification by epitaxial growth of the second semiconductor material on the donor substrate after the contacting of this substrate with the liquid phase.

In this respect, the applicant has given joint consideration to the following.

Epitaxial growth at a point of the substrate is started as soon as this point comes into contact with the liquid phase (if there remains no parasitic layer on the surface that may delay the phenomenon).

On account of their very rapid loss of energy, due to the very high heat gradient, the first atoms of the liquid phase condense on the surface and link with the atoms on the surface of the substrate.

If the temperature of the substrate at this moment is sufficiently high, if the initially chosen temperature was notably higher than ambient temperature (e.g., 600° C.), the atoms maintain sufficient energy and, hence, mobility for their incorporation onto suitable sites in terms of crystalline structure, even if these sites lie at a few interatomic distances from the initial position of the atom.

With regard to conventional CVD epitaxy, epitaxial growth often initially takes place by forming dispersed islands on the surface, which grow bigger over time and end up by coalescing together to give a final continuous layer.

With regard to the case in the invention, growth will start on the points of part of the surface that first enter into contact with the liquid surface, and gradually as and when the contact surface extends, growth will extend to the entire surface of the donor substrate.

Under these conditions on the surface of the donor substrate, at least during the first instants (fraction of a microsecond) following after the contact, there will be zones of epitaxied silicon, "zones" separated by bare regions (without any silicon epitaxy—here, the example is taken of silicon for the second material).

The thickness of these epitaxied zones varies from one zone to another and is directly dependent on the time at which the surface of the substrate that carries this zone entered into contact with the liquid surface.

Over time (from one to a few μs), all these zones will coalesce together and give a continuous layer, in similar manner to coalescence events during epitaxy of CVD type (but in this last type of epitaxy, the flow of atoms condensing on the surface is smaller by several orders of magnitude than is the case in the invention—the depositing rate lies rather more in the range of one micron per minute, or per hour), and the dynamics of atomic re-arrangement have the time that is necessary to be efficient.

With the epitaxial deposit used in the invention, the order of magnitude of the deposit rate is one micron per microsecond, and to optimize the method, attention can be given to events at the junction limits between regions.

For the sake of optimization, it is also possible to focus on thermal phenomena during the first instants following after contacting.

The form of the law of variation in temperature of a point in the vicinity of the surface of the substrate will be substantially the same at every point, but from one point to another of the surface, this law may be staggered over time in relation to the moment of entry into contact of the point with the liquid phase.

This risks generating heat gradients in the plane of the surface of the substrate.

On the basis of these reflections, a way is advantageously sought for minimizing this non-simultaneity of entry into contact, or a manner for determining a non-simultaneous method able to lead to defect-free crystalline growth.

In this perspective, the following considerations are advantageously taken into account.

Figure 7:
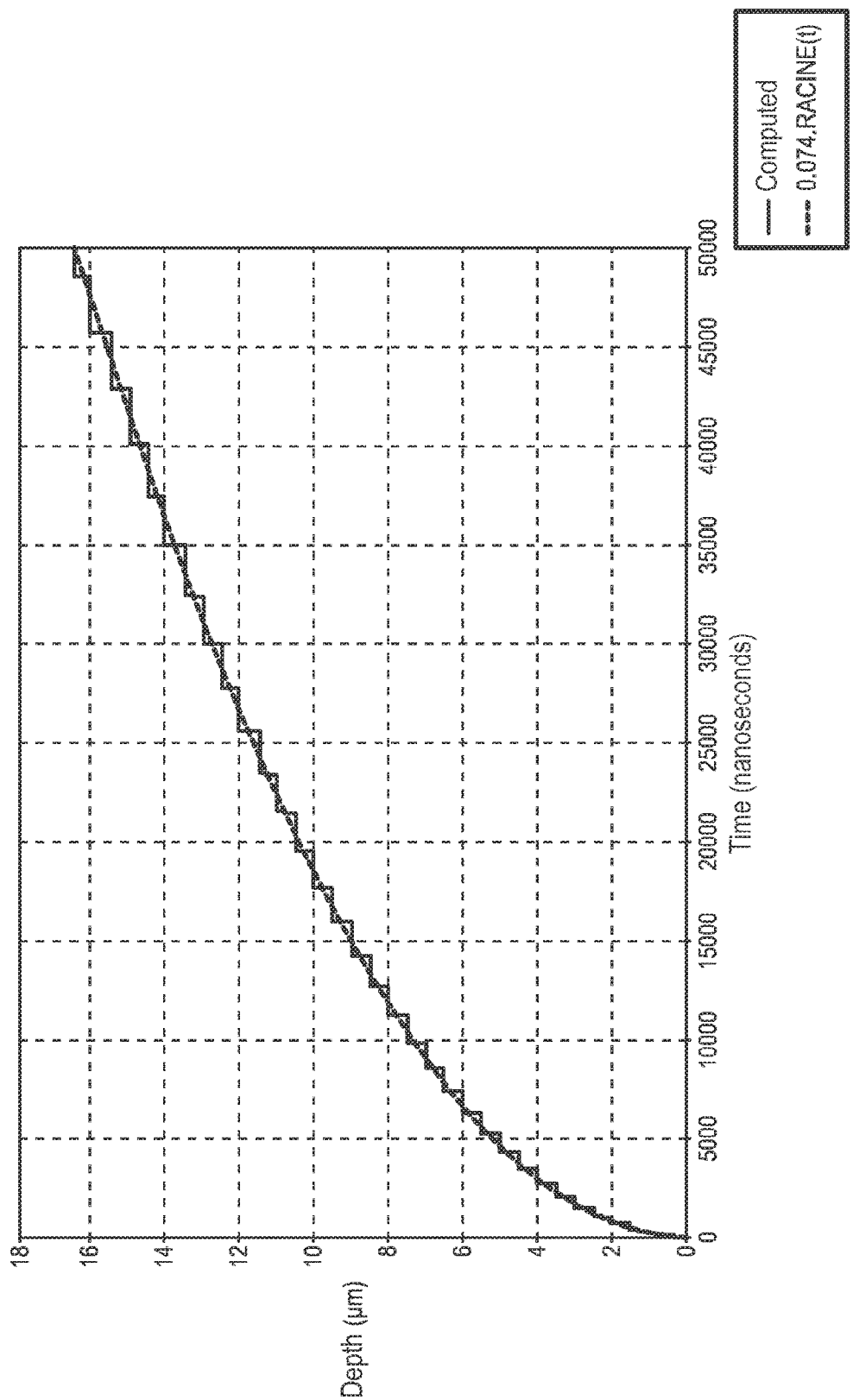

As illustrated in FIG. 7, the thickness Ep of the second crystallized material varies substantially as a square root of time function:

$$Ep = k * t^{0.5}.$$

The values of k depend on the initial temperature. With t in μs and Ep in μm, k=2.3 for ambient temperature, k=1.2 for a temperature of 600° C.

This growth as a square root of time can be accounted for by the fact that the diffusion of heat is also a first order law in which the influencing parameter is the square root of (D*t).

It can be considered that the surface of the donor substrate forms an angle $\alpha$ (of small value in order to respect here again the first order geometric approximation sin $\alpha$=tan $\alpha$=$\alpha$–typically less than 5 degrees) with the surface of the liquid at the time it enters into contact with the liquid.

Taking v to be the rate of approach of the substrate (the rate at which the substrate approaches the liquid surface), the time interval separating the entry into contact with the liquid of two points of the surface of the substrate separated by distance x is equal to:

$$\delta t(\sqrt{}s) = 10,000 * \alpha * x(Cm)/v(\mu m/\mu s).$$

If the value of v is 1 m/s, for example, and $\alpha$=1 E$^{-4}$, then $$\delta t(\mu s) = x(cm).$$

This translates by the fact that, considering a low point and a high point of the surface (angled at an angle $\alpha$) of the donor substrate, the two points being separated by one centimeter, after one microsecond calculated as from the time when the low point (which first contacts the liquid) has come into contact with the liquid surface, the epitaxied thickness on the substrate at this low point will be, e.g., from 1 to 2 microns, whereas at the high point, it will be zero since the contact and hence the epitaxy are started just at this instant.

From a time viewpoint, the thickness differential of the first instants is attenuated over time, i.e., as and when the epitaxied layer grows.

Figure 9:
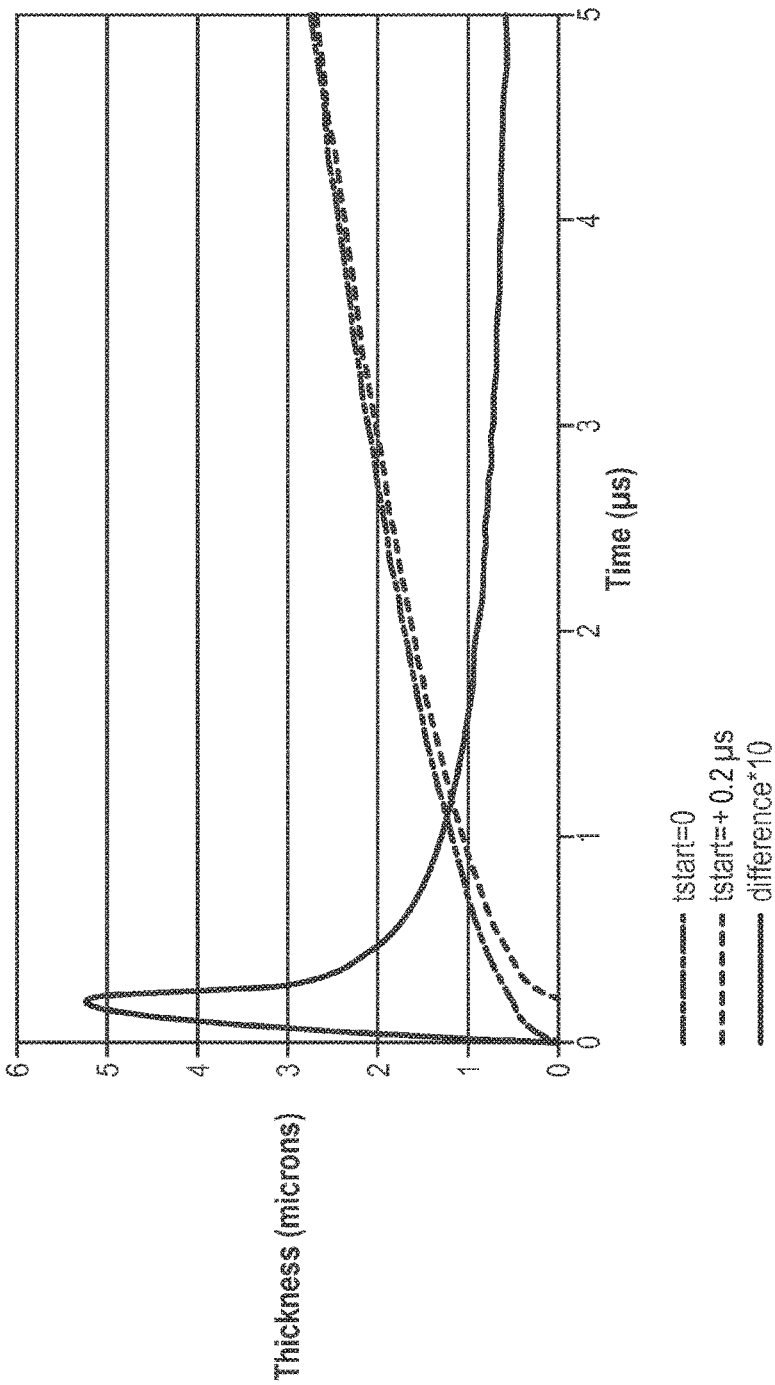
FIG. 9 illustrates growth by epitaxy, as a function of time, of a layer on a donor substrate at the initial temperature of 600° C., for two points corresponding to epitaxy starting times separated by 0.2 μs, and the difference in thickness of epitaxied material as a function of time for these two points.

This is illustrated in FIG. 9, which illustrates growth as a function of time of a layer on a donor substrate at an initial temperature of 600° C., for two points, corresponding to times of epitaxy initiation separated by 0.2 µs, and the difference in thickness as a function of time for these two points.

This figure shows that the maximum thickness differential of 0.5 µm occurs at the moment when the second point just arrives in contact with the liquid and that subsequently this value of the thickness differential continually decreases to reach a value almost ten times smaller after five microseconds, i.e., for a thickness of epitaxied material of the order of 2.7 µm.

This decrease in the thickness differential as and when growth takes place between two points between which initiated growth has been offset by δt may seem to be paradoxical.

For better apprehension thereof, the applicant has considered the combination of the following perspectives:
- these two points of the surface of the substrate have identical history over a length of time that starts from the initiation of growth up to t−δt (where t is the time during which the substrate was contacted with the liquid at the first point—the lowest point),
- over and beyond this identical history, the substrate continues to undergo growth at only one of the points (the second-the highest), for an additional time of δt,
- yet, the rate of growth of the epitaxied thickness decreases when time increases.

From a spatial viewpoint, the epitaxied thickness depends on the time of initial contact with the liquid.

Figure 10:
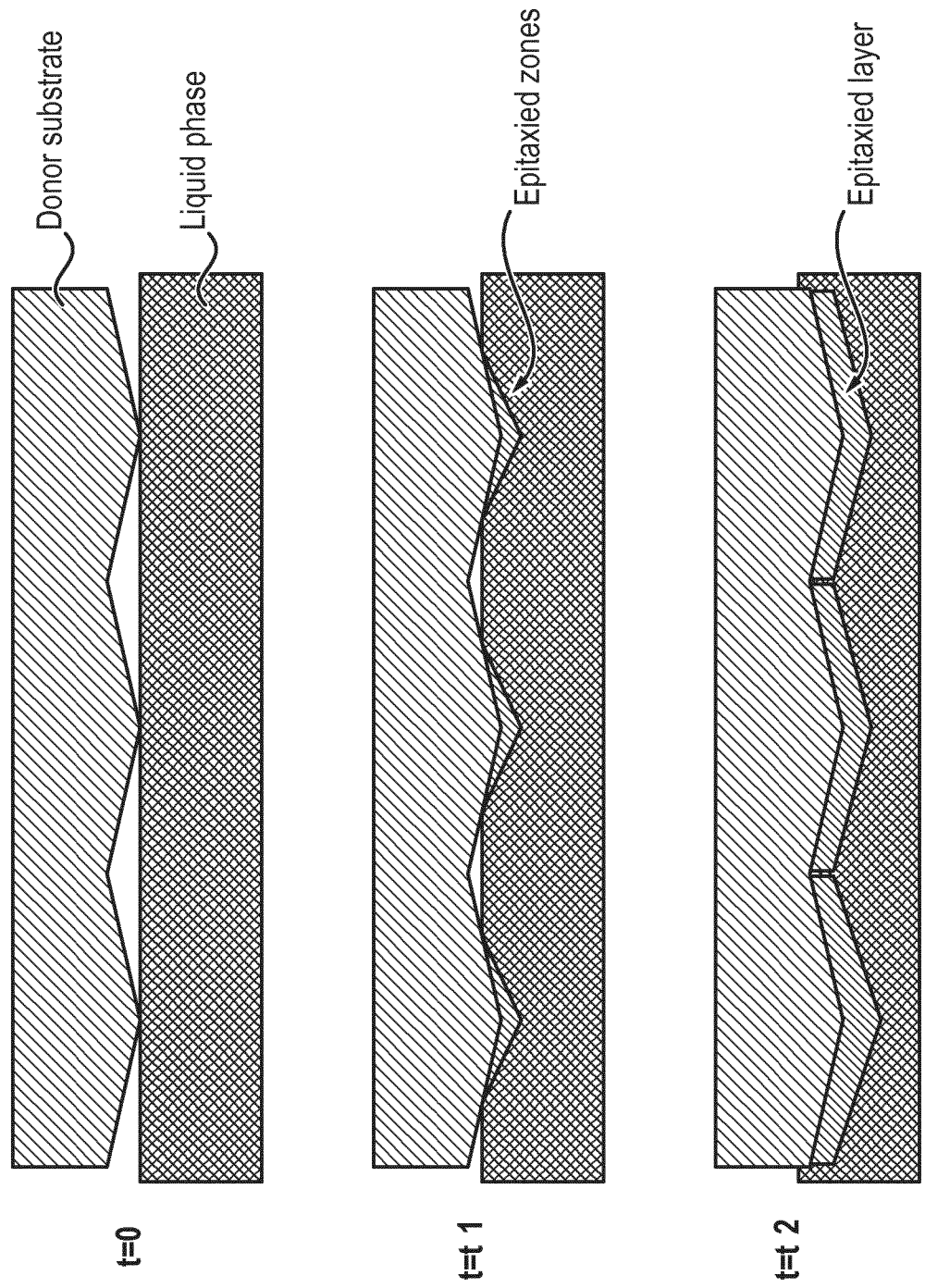
FIGS. 10 to 12 give three epitaxial growth schematics of material on the surface of a donor substrate, for three different configurations of substrate surface and orientation.
Figure 11:
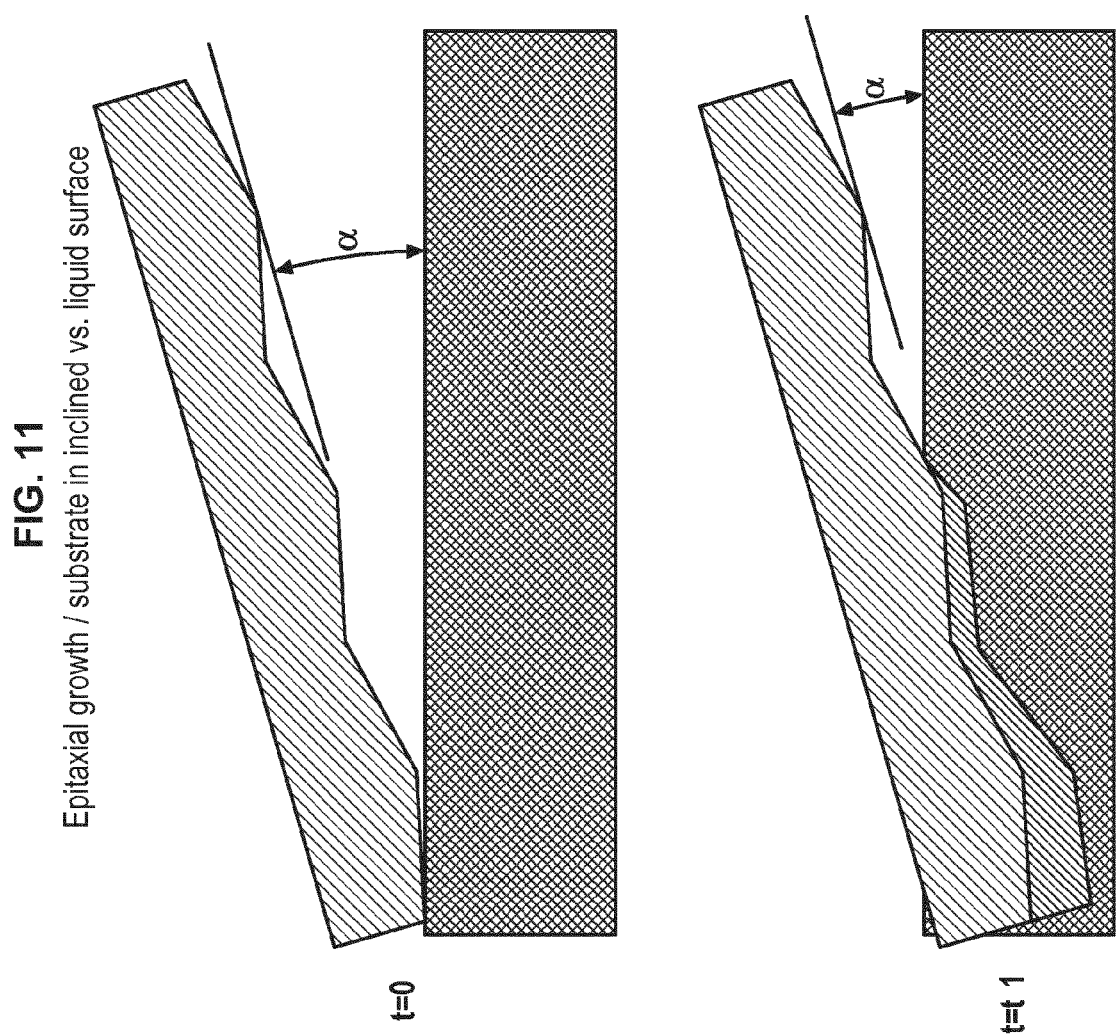
Figure 12:
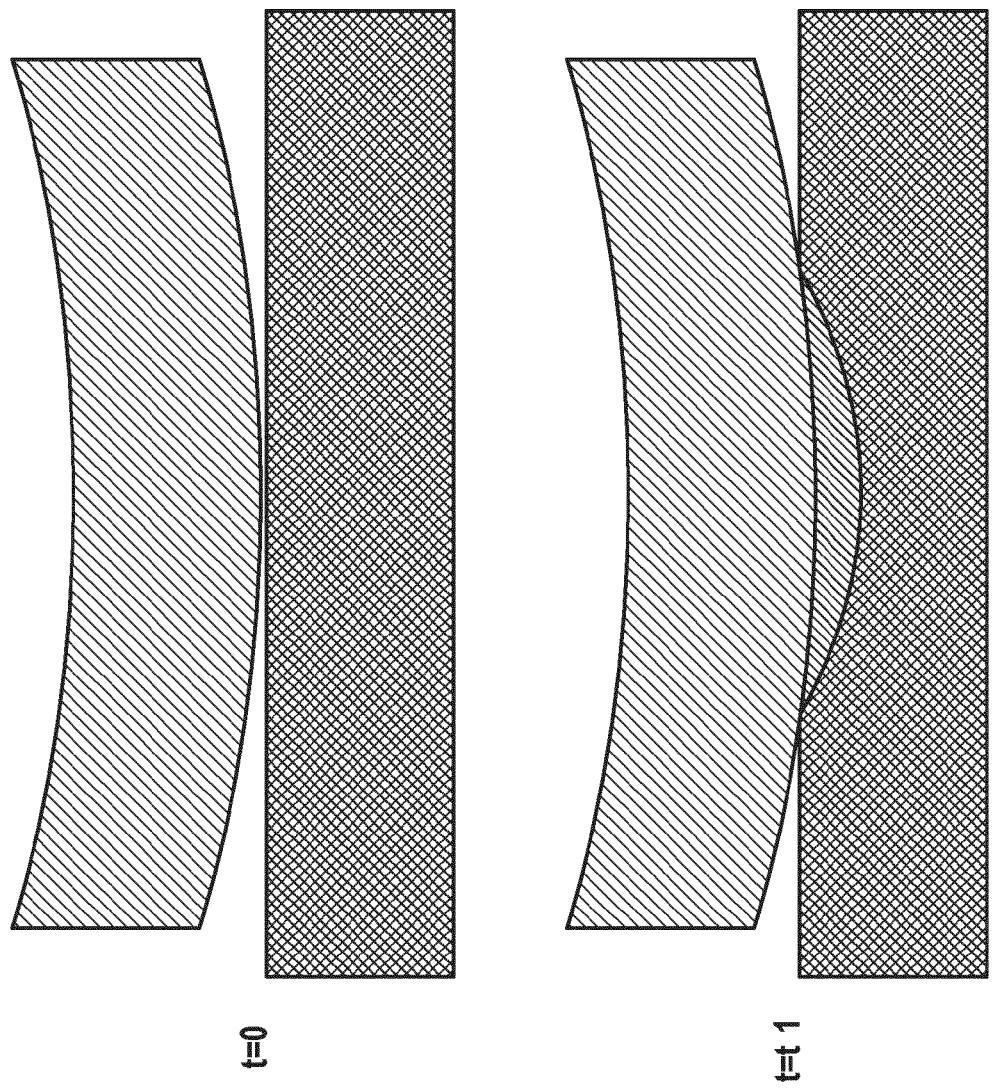

This is expressed in the growth schematics described in FIGS. 10 to 12 (it will be noted that in FIGS. 10 to 12, the ratio of the vertical scale to the horizontal scale is not heeded; in reality, the order of magnitude of the relief amplitudes or non-parallelism are of the order of one micron to several tens of microns and the horizontal scale represents mm or cm).

These three figures, FIGS. 10 to 12, schematically illustrate successive time sequences, ti, following after the contacting of a donor substrate (shown at the upper part for each time) with a bath of liquid material (shown in the lower part). The parts formed by epitaxy are illustrated between the substrate and the liquid material bath as from time t1.

FIG. 10 illustrates events when the parallelism between the surface of the donor substrate and the liquid surface is perfect, but the surface of the donor substrate has an uneven relief (schematically illustrated here by a saw-tooth profile).

As illustrated, at time t1, growth occurs initially via isolated so-called epitaxy initiation regions centered on the points of maximum altitude of the surface of the substrate.

The layers of material epitaxied from these epitaxy initiation regions finally join together at epitaxy meeting surfaces, between two epitaxy initiation regions of the surface of the substrate.

It is possible that this epitaxial joining up at meeting surfaces of the epitaxy is not problem-free.

FIG. 11 illustrates what occurs if the donor substrate has the same surface relief as in FIG. 10, but for which care has been taken to place the surface of this substrate at an angle to the bath of liquid material (the angle being measured in relation to the plane of the surface of the liquid) at a sufficient angle so that the tilting of any element of the surface of the donor substrate is of the same sign, to prevent any problem that could arise in epitaxial meeting surfaces.

In this case, although the surface of the substrate has different altitude points, growth effectively takes place via a single region that extends over the entire surface of the substrate as soon as contact is made. There is, therefore, no longer any meeting zone in this case between epitaxy initiation regions.

Priority is, therefore, to be given to this configuration in which, in particularly advantageous manner, during the contacting of the surface of the donor substrate with the liquid, at every point there is continuity of the sign of the local angle of entry of the local surface of the substrate with the liquid.

It is, therefore, possible, in practice, to take into account deformations of the surface of the donor substrate. In this respect, the surface deformations of the donor substrate are measured so that, on the basis of these measurements, in every point of the surface of the substrate, the local contacting angle of the substrate with the liquid can be determined, which will allow the above-mentioned condition to be met (that during the contacting of the donor substrate surface with the liquid, at every point there is continuity of the sign of the local angle of entry of the local surface of the substrate with the liquid).

In particular, consideration may be given to deformation factors such as the warp and bow of the donor substrate, which can be measured and used to deduce the entry angle of the donor substrate into the liquid.

It is also possible to impose a topology on the surface of the donor substrate by placing it on a chuck of suitable shape. It is, therefore, possible, for example, to envisage the use of a chuck of semi-spherical dome shape as illustrated in FIG. 12.

It will be noted that the entry configurations illustrated in FIGS. 11 and 12 also promote good evacuation efficiency of residual atmosphere gases, thereby preventing the trapping of gas molecules between the liquid surface and the donor substrate surface.

Variant: Wave Epitaxy

A variant for carrying out the invention is an approach invented by the applicant and herein called "wave epitaxy."

This term is chosen here by analogy with the term "wave soldering" used for soldering components in printed circuit technologies.

Figure 13:
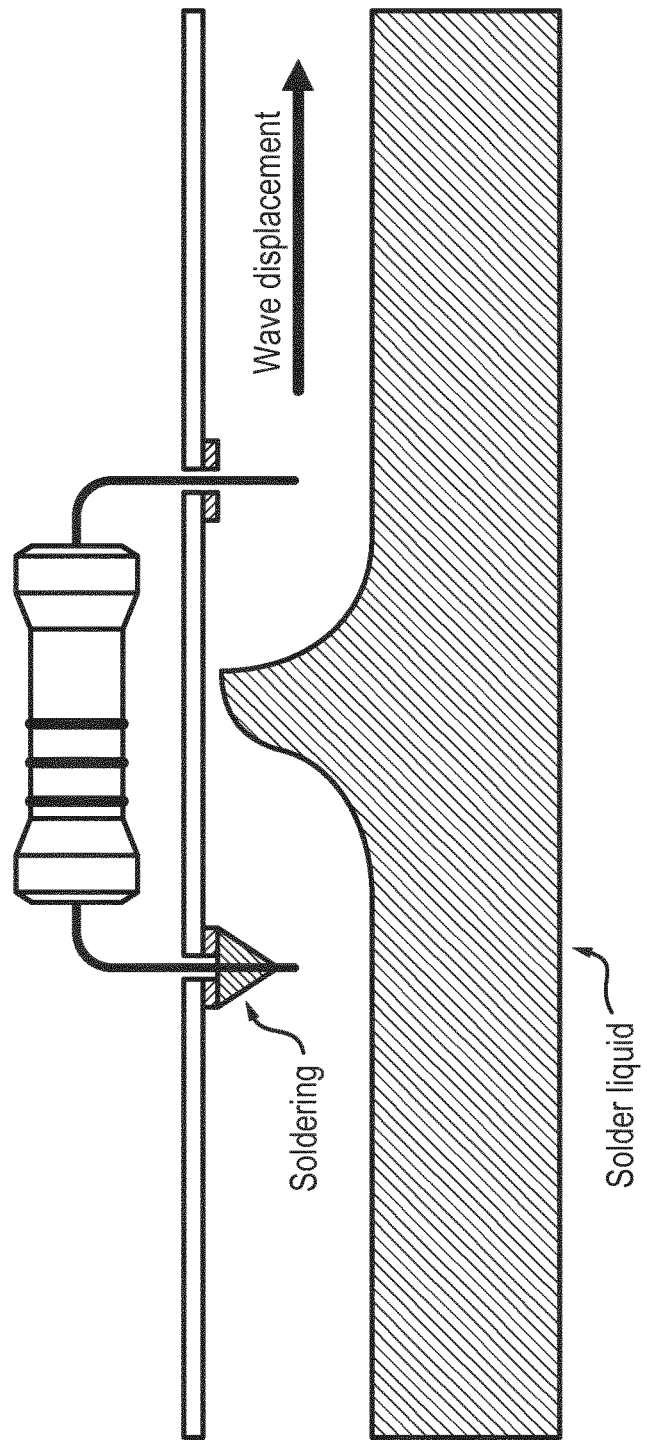
FIG. 13 is a block diagram recalling the general functioning of wave soldering or brazing in the field of component soldering (different from the field of the invention).

The applicant has formed the idea of transposing the technology of printed circuits (schematically recalled in FIG. 13) to the field of the invention, the liquid tin bath being replaced by a semiconductor material bath such as liquid silicon, the back face of the printed circuit being replaced by the surface of the donor substrate.

In the case of the invention, a wave of liquid material is generated in the bath of the second semiconductor material held in the liquid state, and the wave comes in contact with the surface of the donor substrate. The substrate is placed more precisely, and the height of the wave is controlled, so that the surface of the substrate is in contact with the liquid material of the bath only at the spot of the wave. Thus, a given area of the surface of the substrate will be contacted by the liquid material only for a limited time, i.e., the time that the wave passes over (or rather, under) this area.

The means for generating the wave may be of the same type as those used for generating a tin wave for wave soldering.

The temperature ranges of the liquid material will be, of course, different from the temperatures ranges used for wave soldering. These ranges will be adapted so that the second material is kept liquid.

In this manner an "epitaxy wave" is created.

The rate of movement of the wave and the rate of epitaxy do not have the same order of magnitude. In practice, the rate of movement of the wave with respect to the surface of the substrate will be of the order of a few centimeters per second and the rate of epitaxy will be of the order of a few micrometers/microseconds.

As a result, when a region of the substrate surface is in contact with the wave during a time Δt, for epitaxy in this region, everything occurs as if the regime is stationary in a static wave-free bath. The epitaxied thickness on this region, therefore, mostly depends on the passing time of the wave of liquid material at one point (we will keep to the example of silicon).

To control the thickness of material solidified in one wave pass, the characteristics of the wave are controlled (shape of the wave, optionally, wave travel rate and/or height of the wave, i.e., depth of liquid silicon).

This variant opens up prospects of interest in terms of yield. It is effectively possible to rapidly obtain a large number of substrates.

This variant is also particularly advantageous in terms of the structuring of the epitaxied layers.

With this variant, it is effectively possible to subject a donor substrate to several successive waves, waiting for the material of one wave to solidify on the surface of the substrate before passing a following wave on the same substrate (thickened by the epitaxy of the wave that has just passed over it).

And in this manner, an epitaxy donor substrate can be subjected to several successive waves. Each wave may be in the same or a different material. If different successive materials are used (e.g., silicon with different types of doping, without this being limiting) it is possible to successively obtain on the same donor substrate the different types of layers corresponding to each of these waves.

Materials

Advantageously, the surface 31 of the donor substrate 30 is in single-crystal semiconductor material (e.g., single-crystal silicon or single-crystal germanium or silicon-germanium, or any other semiconductor material). In this case, the solidification of the liquid material, if it is of the same chemical type as the material of the donor substrate, or if it exists in a crystalline form adapted to the crystalline network of the donor substrate (i.e., having a lattice parameter equal to within 5% to that of the material of the donor substrate) will take place in particularly ordered manner producing a crystal material of very good quality.

The material of the bath 20 may, therefore, be silicon, germanium or silicon-germanium. It may also be another semiconductor material.

At all events, the semiconductor material of the bath is chosen so that its melting point is equal or lower than the melting point of the semiconductor material of the donor substrate.

In general, the sequence followed at this stage of the method is the following:

Applying the heating means 110 to melt the bath material 20.

Once melting of the bath material 20 has been obtained, holding this material in the liquid state with homogeneous temperature in the material.

In this respect, the heating means 110 can be assisted by an additional heating system such as high frequency induction heating means located underneath the vessel to maintain the material in the liquid state. It is also possible for this additional system to take over from the heating means 110 once the bath material 20 is liquid—in this case, the heating means are used at an initial stage to bring this material to the liquid state, and the additional system is then used to maintain this material in the liquid state while the heating means 110 are inactivated and moved away to clear the access to the surface of the bath.

Contacting the surface 31 of the donor substrate 30 with the surface of the bath liquid 20. In this respect, the heating means 110 will have been moved away if they were placed facing the surface of the bath.

After this contacting, the bath is left to cool gradually. For this purpose, the action of the heating means 110 and/or of the additional heating system is stopped or optionally controlled to obtain the desired temperature decrease. In the description given below, it is considered that this action is stopped at the time of initial contact.

Kinetics of Heat Diffusion

For successful implementation of the method, the person skilled in the art will advantageously give consideration to some conditions of heat diffusion kinetics.

During the conducting of this method, the material that was initially in liquid form in the bath 20 gradually cools down and a solidification front travels over it starting from the surface 31 and extending parallel to the surface 31, which will propagate in the bath material in a direction substantially perpendicular to this surface and away from it.

At the same time, the donor substrate 30 will heat, receiving the heat diffused by the bath 20.

Care must be taken that the donor substrate 30 does not heat up too much to prevent deterioration or damage thereto.

This is particularly the case if the donor substrate 30 comprises a weakened zone as is schematically illustrated in FIG. 2. In this figure, the donor substrate 30 comprises a weakened zone 33.

In this case, an excessive heat input to the weakened zone might activate physical phenomena at this region, which may deteriorate the substrate, in particular, by causing blistering on its surface.

To avoid this, the person skilled in the art may usefully consider the following aspects:

In the following, the description is taken from the perspective of preventing the weakened zone from receiving a heat budget exceeding the threshold that would lead to blistering of the surface of the donor substrate. This corresponds to a particular case, which can be directly extrapolated to the general case in which it is desired to limit the heat budget received by the donor substrate whether or not it comprises a weakened zone.

The desire is to estimate the heat budget that will be received by the weakened zone throughout the method, from the initial contacting up until solidification of the desired thickness of material on the surface 31 of the donor substrate 30 (this desired thickness corresponding to all or part of the bath depth).

More specifically, with respect to a donor substrate comprising a weakened zone, it is desired to prevent the heat budget reaching this region from leading to blistering of the surface of the donor substrate.

If the weakened zone is closer to the surface 31 than to the back face 32 it is at this face 31 that blistering may occur. This is the assumption used in the remainder of this text.

Once the initial contacting between the surface 31 and the bath has been made and the heating means 110 has been stopped so that the bath 20 is no longer being heated, two processes are initiated.

The first process is the diffusion of heat in the donor substrate. It is this process that may lead to blistering.

A second process is the growth of a layer of solidified material on the surface 31 of the donor substrate 30. This layer is illustrated under reference 50 in FIG. 3. It is this process that leads to the fabrication of the desired layer. Accessorily, it is also this process that, beyond a certain thickness of solidified layer, will prevent any risk of blistering.

Figure 4:
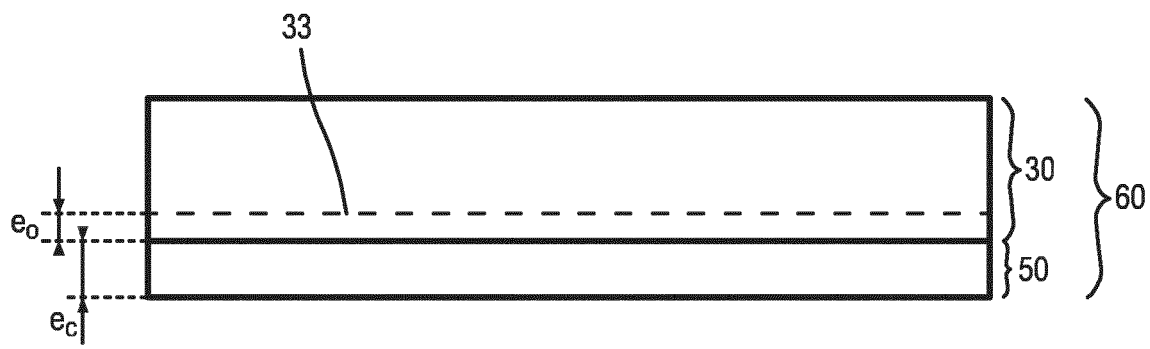
FIG. 4 illustrates a substrate obtained using the invention, with its layer of solidified material.

With the method described herein, it is possible to fabricate a substrate 60 that, as illustrated in FIG. 4, comprises:
- the donor substrate 30, optionally provided with a weakened layer 33, and
- the solidified layer 50 of thickness "$e_c$" of material derived from the bath 20.

The second process, by which growth of the layer 50 is obtained by solidification, reduces the risk of blistering associated with the first process, for two reasons:
- first, by thickening the layer of material separating the weakened zone from the liquid, it moves the heat source away from the weakened zone, and
- second, as from a certain thickness of the layer 50, the total thickness of the layer of material separating the weakened zone from the liquid reaches and exceeds the thickness beyond which blistering is no longer possible.

The phenomenon of blistering starting from a weakened zone comprising microcavities can only be envisaged if this region is not located at a deep depth (depth e0 in FIG. 4) in the substrate 30.

For silicon, as for germanium, this thickness is between about 7 μm and 10 μm. The exact value in this range depends on implanting conditions, but in the description of this text, there is no need to have precise knowledge thereof since it is sufficient to use as a safety value the value corresponding to the "worst case," i.e., the maximum value of 10 μm.

By verifying that the method will function with e0=10 μm, it can be ensured that it will also function, in the same material, irrespective of the precise value of this critical depth.

For silicon-germanium alloys, the maximum value of this range is also 10 μm.

Each material is, therefore, associated with a critical depth beyond which blistering is no longer likely to occur; when the thickness covering the weakened zone exceeds the critical depth, this thickness of material contains the stresses that may be generated at the weakened zone so that they are not released on the surface of the substrate to generate blistering thereupon.

It is pointed out that, for the sake of convenience, indifferent reference will be made to critical depth or critical thickness—it is the depth at which the weakened zone lies under the surface 31 of the donor substrate 30, which can also be considered to be the thickness of donor substrate material that covers the weakened zone. The terms "critical thickness" and "critical depth" are, therefore, equivalent in this text.

The applicant has realized that the antagonism between the two processes set forth above, which obey different kinetics, could be used for the implementation of substrate fabrication via solidification, even in the case when a particularity such as a weakened zone, lays down limits in terms of heat budget.

The kinetics of the solidification process (second process mentioned above) are much faster than the kinetics of the heat diffusion process toward the weakened zone (first process) mainly due to the creation, at the time of contacting with the liquid phase, of a strong temperature gradient at the surface of the donor substrate.

To have a good idea of the kinetics of the method before it is implemented, and thereby determine whether the envisaged parameters are suitable, it is possible to proceed as follows.

It is known that if the duration of heat treatment D0 is known that, at a temperature T0, corresponds to the onset of a blistering phenomenon on the surface of a substrate comprising a weakened zone; for another temperature Tz the duration D corresponding to the onset of blistering in an identical substrate can be inferred from the values (D0, T0) by a law of type:

$$1/D(Tz)=(1/D0)\cdot EXP(-(Ea/k)*(1/Tz-1/T0)) \qquad \text{(law 1):}$$

where:
- D0 is the duration of exposure of the weakened zone to a temperature T0, defining a point (D0, T0) at which it is known that blistering occurs on the surface of the substrate,
- D is the duration of exposure of the weakened zone to a temperature Tz, a duration for which, for the same substrate, blistering will occur,
- Tz is the temperature to which the weakened zone is exposed,
- Ea is an activation energy value,
- k is Boltzmann's constant.

In the literature, it is indicated that the law of time of exposure to the temperature on and after which blistering may occur has behavior of the type of physical phenomena governed by an activation energy.

Evidently, this type of law is valid for weakened zone depths smaller than the critical thickness. For a greater depth, blistering no longer occurs.

Figure 5:
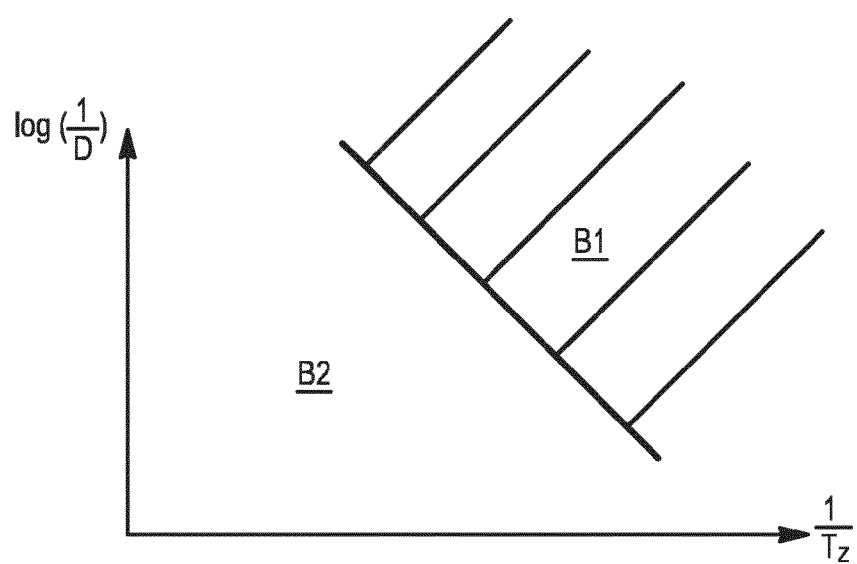
FIG. 5 is a graph illustrating the general appearance of a curve corresponding to the onset of blistering on the surface of a substrate in semiconductor material comprising a weakened zone and exposed to heating.

This type of law, in a graphical representation of Log(1/D) as a function of (1/Tz), translates as a straight line as illustrated in FIG. 5.

The person skilled in the art will easily find laws and curves of this type in the literature, for different configurations (type of substrate material, type of ions implanted to form the weakened zone, implanted dose, implanting energy).

While the scientific literature does not directly give access to this law for the chosen configuration, it is sufficient to conduct two blistering experiments at two different temperatures on identical substrates and to measure the heat treatment time needed at these two temperatures to obtain blistering. By plotting the two experimental points on a graph (1/T) along the abscissa, Log(1/duration) along the ordinate, the law can be fully determined.

It will, therefore, be sought to remain within a domain B1 (defined by values of duration D and temperature Tz)—i.e., a heat budget domain—corresponding to the side of the straight line in FIG. 5 that is cross-hatched, which does not lead to blistering. Domain B2 is to be avoided.

It will now be indicated how the person skilled in the art, from the initial conditions of the method, can predict whether or not blistering of the donor substrate may be generated.

To determine in which portion of the plane in FIG. 5 one is situated, recourse is made to a model of trend in temperature Tz at the weakened zone.

This temperature evolves in accordance with a law Tz=f(t), where t represents time. It is possible to determine the law f(t) using a numerical method, for example, the method of finite differences using commercial software, to solve the heat equation taking into account the phase change, which involves transfer of the latent heat of fusion. This calculation is all the simpler and quicker since a mere single-dimensional simulation is sufficient to obtain results relating to reality.

To obtain a value of Tz=f(t) use is made of initial conditions and of limit conditions.

The initial conditions entered into the simulator for computing are essentially the following:

Value of the initial temperature of the substrate,
Temperature of the material in the liquid state in the bath 20,
Thermal properties of the donor substrate material. More specifically, for this solid material, these are the following characteristics:
thermal conductivity,
density,
heat capacity in the solid state.
Thermal properties of the initially liquid bath material. These are the same characteristics as for the donor substrate material, but both for the solid state and for the liquid state of the bath material. Also taken into account is the latent heat of fusion of this material.
Value e0 of the depth of the weakened zone underneath the surface 31.

The limit conditions of the calculation to be specified are the heat conditions on the back face of the substrate.

These heat conditions on the back face of the substrate must be specified in particular if the thickness of the substrate is shorter than or comparable with the length of heat diffusion in the donor substrate for the duration of the solidification process. In this case, the heat energy will diffuse as far as the back face and the temperature profile in the material is affected by the presence of this back face and the heat conditions thereat. For these heat conditions on the back face, the options that can be envisaged are:

either no heat exchanges if the back face is heat insulated,
or constant temperature if the back face 32 of the donor substrate is in close contact with means holding the back face at constant temperature.

In this latter case, in practice, this can be achieved by making provision, for example, that the chuck means 40 are temperature-regulated and maintain the back face of the donor substrate at a constant set temperature.

The same simulation also provides the trend in thermal energy density in the bath material 20, after the initial contacting.

In this respect, the simulation, in particular provides knowledge, at every point, and as a function of time, of the value of the energy density of the latent heat of fusion. This makes it possible to identify, as a function of time, the position of the boundary between the fully solidified part derived from the bath material 20 and the part still partly in the liquid state of this bath.

This boundary corresponds to the limit of the region where the thermal energy density of the latent heat of fusion is Zero.

In this manner, the position of the solidification front in the bath is obtained as a function of time. This front advances with time, moving away from the surface 31 of the donor substrate. This solidification generates a single-crystal material of very good quality, in particular, when the surface 31 of the donor substrate is in single-crystal material whose lattice parameter is close to that of the material being solidified.

It is specified that the semiconductor material of the donor substrate—silicon, for example—may be the same as the semiconductor material of the bath 20, but this is not compulsory. It is possible to provide for different materials.

The sequence of the steps of temperature simulation and heat budget determination to avoid the risk of blistering can be summarized as follows.

First, using thermal simulation, a law Tz=f(t) is determined on the basis of initial conditions and limit conditions such as set forth above. This gives the value of Tz, the temperature at the weakened zone, for every time value t.

The same thermal simulation also affords access to the position of the solidification front in the bath 20 at every time t. This also gives access at every time t to the thickness e(t) of the solid material separating the weakened zone from the solid/liquid interface:

$e(t)$=thickness $e0$+thickness of solidified material at time $t$ on surface 31.

e0 is the thickness of material initially separating the weakened zone 33 from the surface 31 of the donor substrate 30 as illustrated in FIG. 3.

Knowledge of the thickness e(t) is used to determine from which time t this thickness exceeds the value of the critical depth of the weakened zone. Beyond this value, the risk of blistering disappears.

Tz(t) is, therefore, known for each time t. Knowledge of Tz(t) and of D(Tz) gives knowledge of the law D(Tz(t)).

For a temperature Tz(t) in the vicinity of dt at a given time t, the quantity:

$$dt/D(Tz(t))$$

represents the fraction obtained, during the time interval dt, of the quantity of heat activation needed to arrive at blistering of the substrate.

Since Tz varies over time, the fraction that is obtained during a time interval of 0 to t1, of the activation by heat treatment that is needed for blistering of the substrate, is expressed by the integral I:

$$I = \int_0^{t1} dt/D(Tz(t))$$

When this integral is equal to 1, this means that the heat activation has reached the value needed for blistering to occur. Before implementing the solidification process, a simulation must, therefore, be carried out to verify whether or not the value of this integral remains less than 1.

If this is not the case, the parameters of the method are to be adjusted (for example, by lowering the initial temperature of the substrate and/or by choosing a greater implantation depth) for a new simulation that is to be repeated until the value of the integral is less than 1.

The upper limit of the integration interval t1 may, therefore, correspond to the planned implementation time of the method.

At all events, it is of interest to the person skilled in the art, before implementing the method, to carry out a simulation to know the duration called the "threshold" that is the duration of the method that, with the parameters intended to be used by the person skilled in the art (type of materials, temperatures, dimensions, etc.), would lead to a thickness of material covering the weakened zone equal to the value of the critical thickness.

Since this duration is not necessarily known beforehand, for a first simulation, the choice will be made of a duration that is sufficiently long so that the crystallized thickness obtained is greater than the critical thickness. If need be, the duration can then be reduced to determine the threshold duration.

The integral I can be calculated using a numerical method since the values of Tz(t) and D(Tz) are known in discretized form.

The value of this integral under consideration, for a duration corresponding to the critical thickness, indicates simply and clearly whether or not the chosen conditions lead to blistering:

If I is less than 1, no blistering will occur,

If I is equal to or higher than 1, there is a risk of blistering if the envisaged conditions of the method used in the simulation are maintained.

These steps, therefore, enable the person skilled in the art to verify on the basis of the initial data set forth above, that the solidification process on the surface 31 of the donor substrate 30 will function correctly, without degradation of the substrate caused by adverse heat effects.

The method of the invention allows a substrate to be fabricated that is formed by the donor substrate 30 and the layer of semiconductor material derived from the bath 20 and covering the surface 31.

As already indicated, this substrate can be of very good crystalline quality, solidification occurring for a single-crystal surface 31 by epitaxy of single-crystalline material.

The thickness of the layer (50 in FIG. 4) solidified on the surface 31 can be precisely controlled, by sizing the depth 101 of the bath. The solidification process is normally stopped when the entirety of the bath material has solidified on the surface 31. It can also be envisaged not to solidify the entirety of the bath material.

The substrate 30 in this text is said to be a "donor" substrate, not only because it provides the surface 31 from which epitaxial solidification is obtained, but also because, if this substrate comprises a weakened zone, it may, either after (or during) epitaxial solidification, give rise to the detachment of a new substrate or layer.

This new substrate comprises:
the part of the donor substrate initially included between the weakened zone 33 and the surface 31 (part 34 in FIG. 3), and
the layer of semiconductor material derived from the bath 20 and solidified on the surface 31.

This new substrate can again be detached by additional heating of the weakened zone and optionally by application of a mechanical stress as is known.

The detachment of this new substrate may also take place during the epitaxial solidification of the layer. Once the thickness of the solidified layer exceeds the critical depth, so that the risk of blistering is eliminated, it is possible to continue thickening the layer and, optionally, on this account, reach the heat budget for detachment, without having to use additional heating.

This makes it possible to form a new substrate of layer that may not only be of excellent quality, but also of controlled thickness, even for narrow thicknesses.

EXAMPLES

As an example, the method can be carried out and a good quality layer can be solidified with the following parameters:
donor substrate material: Si
bath material: Si
Diameter of the donor substrate (disc shape) and of the bath: 300 mm
initial thickness of the donor substrate: 900 microns
bath depth: 100 microns
implantation depth (e0): 2-4 microns (two different values were considered).

According to another example, the following parameters can be chosen:
donor substrate material: Ge
bath material: Ge
initial thickness of the donor substrate: 400 microns
Diameter 150 mm (disc shape)
bath depth: 150 microns
implantation depth (e0): 1 to 2 microns (two different values were considered).

According to another example the following parameters can be chosen:
Si materials for the donor substrate
material (Si 0.9-Ge 0.1) for the liquid phase
initial thickness of the donor substrate: 900 microns
Diameter 200 mm (disc shape)
bath depth: 150 microns
implantation depth (e0): 2 to 3 microns (two different values were considered).

Figure 6:
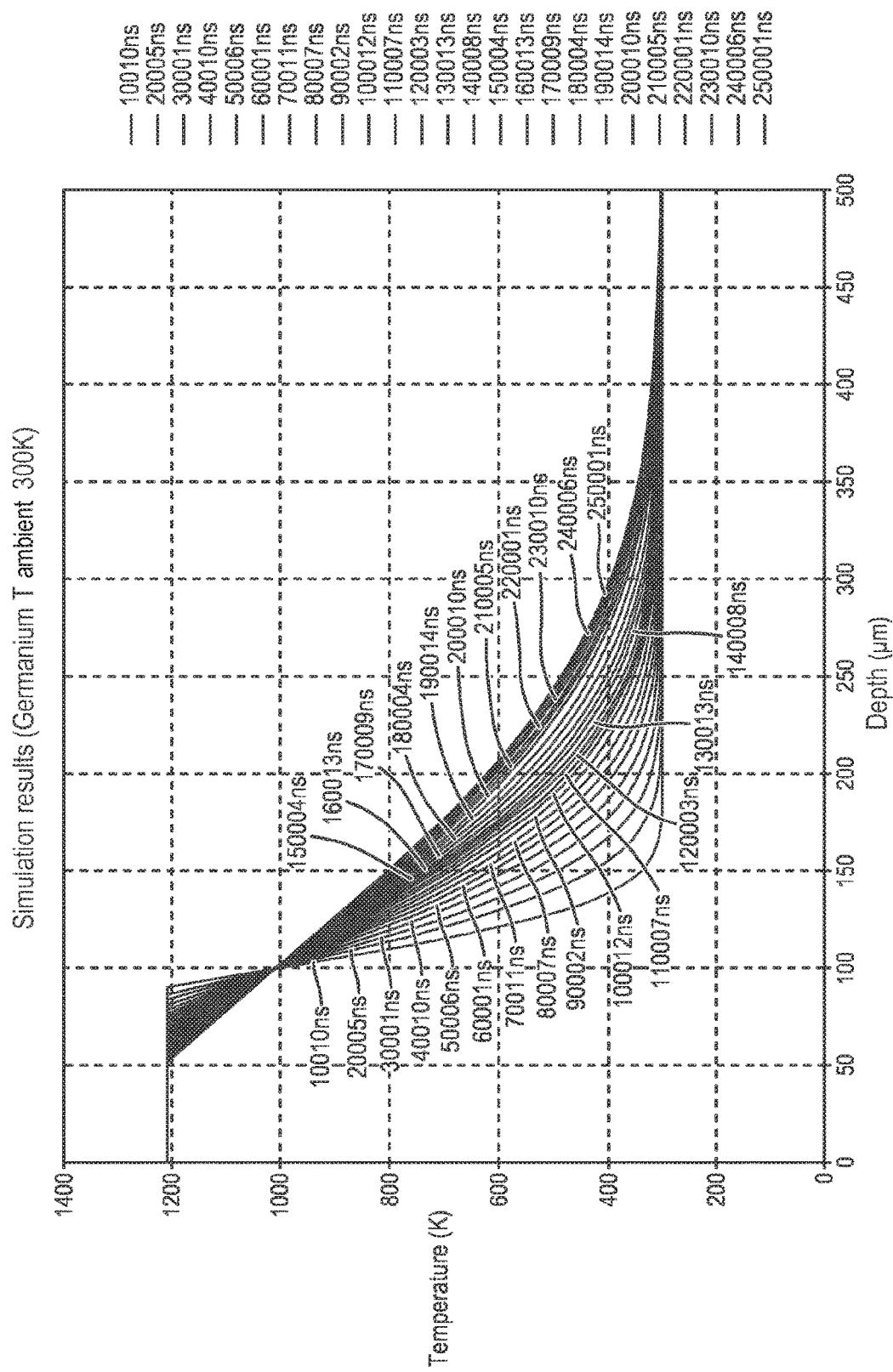
FIGS. 6 to 8 show examples of different simulations of thermal behavior in substrates used for the invention, these simulations having been conducted respectively to illustrate:
the trend over time of the temperature in a germanium donor substrate and in the germanium bath with which this donor substrate is contacted, after the contacting of the substrate with the bath of liquid material (FIG. 6),
the trend over time of the depth in the bath material (here, silicon) of the solidification front of liquid semiconductor material (FIG. 7),
the trend, as function of thickness of solidified (crystallized material), of the value of an integral I, this integral value providing an indication as to the risk of blistering on the surface of the donor substrate.
Figure 8:
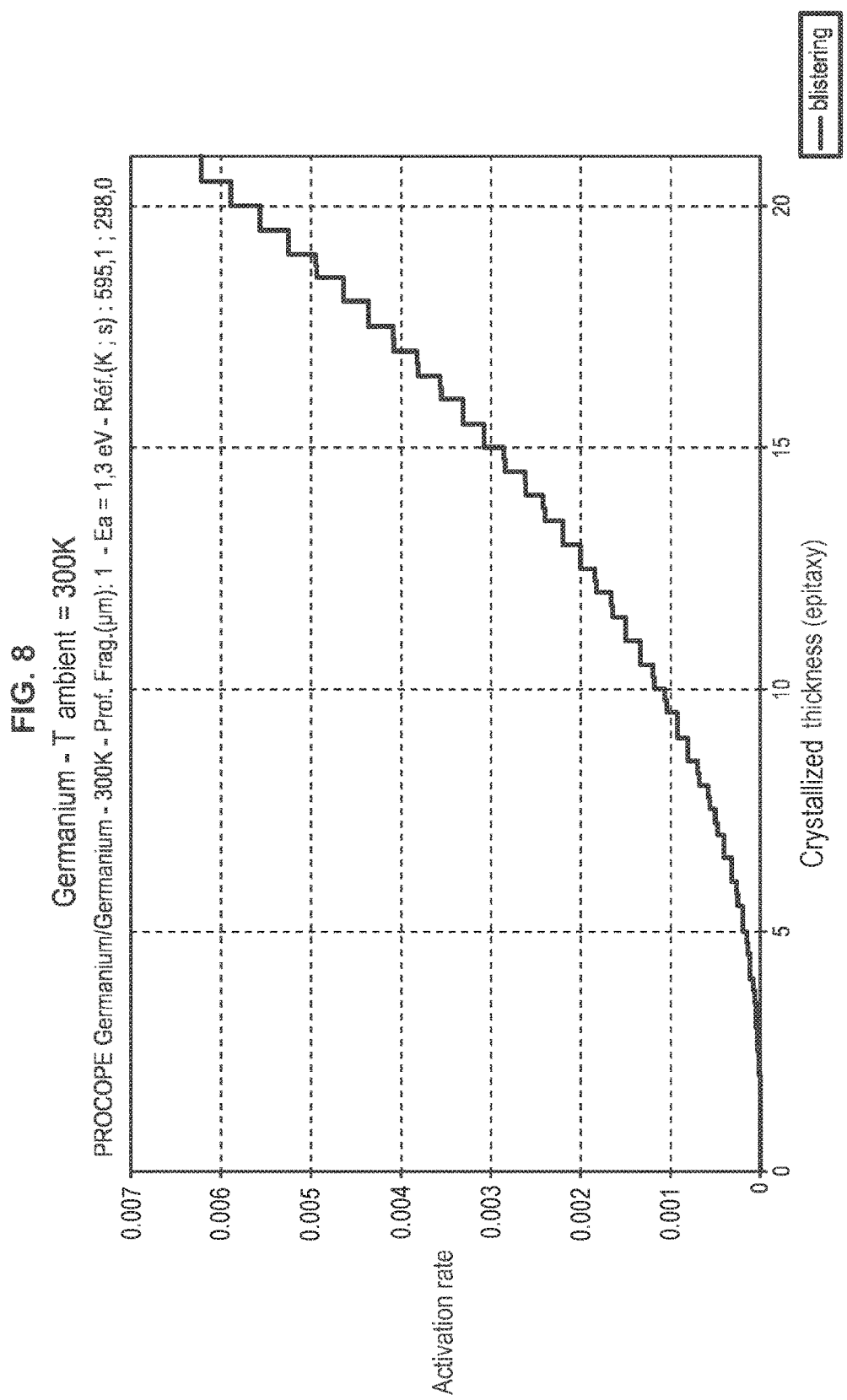

FIGS. 6 to 8 illustrate examples of different simulations respectively performed for:
the trend in temperature over time in a germanium donor substrate and in the germanium bath with which this donor substrate is contacted, after the contacting of the substrate with the bath of liquid material (FIG. 6),
the trend in depth over time, in the bath material (here silicon), of the solidification front (FIG. 7),
the trend, as a function of the thickness of solidified (crystallized) material, in the value of the integral I.

It can be seen in FIG. 6 that, starting from a temperature of 300K, the temperature evolves both in the donor substrate (illustrated in the graph of FIG. 6 by the depths of more than 100 microns) and in the space occupied by the bath (represented by the depths of less than 100 microns).

Therefore, in this graph, the origin of the depths is the bottom of the vessel containing the bath 20, and the depths increase toward the substrate. These "depths" must not, therefore, be confused with the "depth" in the substrate mentioned above.

The curves represent the successive values of temperature, as time progresses, here between 10,010 and 250,001 nanoseconds after the initial contacting.

It is ascertained that the temperature distribution changes from an initial extremely high gradient during the very first instants, mainly in the donor substrate, to a configuration in which the gradient has progressively decreased and extends both in the part initially corresponding to the liquid phase and in the donor substrate.

The thermal energy contained in the liquid layer has gradually diffused toward the donor substrate, which translates as a gradual decrease in the density of latent heat in the liquid part and, hence, as progression of the crystallized thickness.

The thermal simulator calculates the thermal energy density at every point of the assembly (liquid layer+donor substrate) and, therefore, provides access to all this data.

In the space of the bath, when the temperature is reduced down to below the melting point, the material crystallizes (solidifies). Since simulation uses the assumption that the bath material is initially at melting point, this graph directly indicates the values of the solidified thickness over time.

It is also possible to follow the values of Tz(t) at a buried weakened zone in the substrate knowing the depth of the weakened zone.

FIG. 7 shows the trend in depth d over time (in this graph, the depth is the depth in the bath starting from its initial surface). The bath here is a silicon bath. The initial temperature of the donor substrate is 300K, the initial temperature of the bath is the melting point of silicon (1,414° C.).

The graph in step form derives from modeling, which uses discretization. The continuous curve is smoothing of this stepped curve.

FIG. 8 is the result of simulation of the same type in which the "time" parameter has been eliminated.

This figure was obtained by combining:
first, the trend Tz(t), which gives access to the value of the integral I(t) as a function of time on which this integral is integrated,
second, the crystallized thickness as a function of time.

By eliminating time between the two, the value of I is obtained as a function of the crystallized thickness, here in a bath of germanium. It can be seen in this simulation that values remain well below the conditions leading to the onset of blistering on the surface of the substrate.

The invention claimed is:

1. A method for fabricating a substrate comprising a semiconductor material, the method comprising:
providing a donor substrate comprising a first semiconductor material at an initial temperature, the donor substrate having a weakened zone therein defining a layer to be transferred from the donor substrate to another substrate between the weakened zone and a surface of the donor substrate;
contacting the surface of the donor substrate with a second semiconductor material in a liquid state in a bath at a temperature higher than the initial temperature of the donor substrate, the second semiconductor material having a melting point equal to or lower than a melting point of the first semiconductor material; and
solidifying the bath material on the surface to thicken the donor substrate with a solidified layer.

2. The method of claim 1, further comprising selecting the first semiconductor material to be silicon, germanium, or silicon-germanium.

3. The method of claim 1, further comprising selecting the second semiconductor material to be silicon, germanium, or silicon-germanium.

4. The method of claim 1, further comprising providing the bath in a vessel, the bath having a depth corresponding to a desired thickness of the solidified layer.

5. The method of claim 1, further comprising heating the second semiconductor material in the bath to a temperature at least a few degrees higher than the melting point of the second semiconductor material.

6. The method of claim 1, further comprising carrying out the method in a reducing atmosphere.

7. The method of claim 1, further comprising preheating the donor substrate to an initial temperature prior to contacting the surface of the donor substrate with the second semiconductor material in the liquid state in the bath.

8. The method of claim 7, wherein the preheating is carried out at a temperature at least equal to the temperature at which it is possible to carry out an epitaxy having the desired quality.

9. The method of claim 7, further comprising selecting the initial temperature to provide a duration of the preheating of at least several seconds while avoiding blistering of the donor substrate.

10. The method of claim 7, further comprising bringing the donor substrate from a starting state at a starting temperature into contact with the second semiconductor material in the liquid state in the bath within a time that is substantially one second per 100° C. of difference between the starting temperature of the donor substrate and the initial temperature.

11. The method of claim 10, further comprising controlling movement of the donor substrate toward the second semiconductor material in the liquid state and reducing a time spent by the donor substrate at distances less than 1 mm from the second semiconductor material in the liquid state.

12. The method of claim 11, further comprising causing a rate of approach of the donor substrate toward the second semiconductor material in the liquid state to be a decreasing function of the inverse of the distance between the donor substrate and the second semiconductor material in the liquid state.

13. The method of claim 7, further comprising applying a chemical treatment prior to contacting the surface of the donor substrate with the second semiconductor material in the liquid state in the bath.

14. The method of claim 13, further comprising selecting the chemical treatment to comprise a deoxidation treatment using dilute HF.

15. The method of claim 1, further comprising maintaining continuity of a sign of a local angle of entry between the surface of the donor substrate and the second semiconductor material in the liquid state in the bath throughout the contacting of the surface of the donor substrate with the second semiconductor material in the liquid state in the bath.

16. The method of claim 15, wherein surface deformations of the donor substrate are measured so that, on the basis of these measurements, in every point of the surface of the substrate a local contacting angle of the substrate with the liquid can be determined that will allow fulfilling the condition that during the contacting of the donor substrate surface with the liquid, at every point there is continuity of the sign of the local angle of entry of the local surface of the substrate with the liquid.

17. The method of claim 1, wherein contacting the surface of the donor substrate with the second semiconductor material in the liquid state in the bath comprises generating a wave of the liquid second semiconductor material and contacting the with the surface of the donor substrate.

18. The method of claim 17, further comprising causing a rate of movement of the wave with respect to the surface of the donor substrate to be on the order of a few centimeters per second.

19. The method of claim 1, further comprising inserting atomic species into the donor substrate to form a weakened zone within the donor substrate prior to contacting the surface of the donor substrate with the second semiconductor material in the liquid state in the bath.

20. The method of claim 19, further comprising performing a simulation and ensuring that a quantity of heat to be received by the weakened zone during the method will not produce blistering of the donor substrate prior to contacting the surface of the donor substrate with the second semiconductor material in the liquid state in the bath.

21. The method of claim 20, wherein performing the simulation comprises verifying that the value of the integral $$I = \int_0^{\tau_1} dt / D(Tz(t))$$

remains less than 1, wherein:
t1 = a planned time length of the method,
D(Tz) = a duration of exposure of the weakened zone to a temperature Tz leading to blistering, and
Tz(t) = a temperature at the weakened zone at time t.

22. A device for contacting a surface of a donor substrate comprising a first semiconductor material with a second semiconductor material in a liquid state, the device comprising:
- a vessel for containing a bath of the liquid second semiconductor material; and
- a heating device located and configured to heat the second semiconductor material in the vessel, wherein the heating device comprises lamps, and wherein the device further comprises power regulation devices, each power regulation device configured to regulate a power fed to one or more of the lamps;
- an additional induction heating system located underneath the vessel;
- a capacitance measurement system for measuring capacitance, the capacitance measurement system having one electrode to be in contact with a back side of the donor substrate, and another electrode to be in contact with the liquid in the bath to be contained in the vessel;
- a mechanism for varying inclination of a surface of the donor substrate with respect to a surface of the liquid in the bath to be contained in the vessel;
- a processing device configured to determine an angle of inclination to be provided between the surface of the donor substrate and the surface of the liquid in the bath to be contained in the vessel;
- an arm system;
- a main jack system attached below the arm system; and
- a system of fine actuators attached under the main jack system, the system of fine actuators carrying the donor substrate;
- wherein the arm system is configured to move the main jack system, the fine actuators, and the donor substrate to a position at which the surface of the donor substrate is relatively close to the surface of the liquid in the bath to be contained in the vessel;
- wherein the main jack system is movable with respect to the arm system and configured to vertically and precisely move the donor substrate toward the surface of the liquid in the bath to be contained in the vessel;
- wherein the system of fine actuators is configured to vary the angle of inclination between the surface of the donor substrate and the surface of the liquid in the bath to be contained in the vessel; and
- wherein the device is configured to electrically insulate the donor substrate.

* * * * *

UNITED STATES PATENT AND TRADEMARK OFFICE
CERTIFICATE OF CORRECTION

PATENT NO.        : 9,528,196 B2                                          Page 1 of 1
APPLICATION NO.   : 14/131295
DATED             : December 27, 2016
INVENTOR(S)       : Michel Bruel It is certified that error appears in the above-identified patent and that said Letters Patent is hereby corrected as shown below:

In the Specification
Column 1,    Line 47,    change "has been fainted." to --has been formed.--
Column 4,    Line 45,    change "the aiiu system," to --the arm system,--
Column 4,    Line 53,    change "the aim system," to --the arm system,--
Column 7,    Line 19,    change "a layer of" to --form a layer of--
Column 8,    Line 18,    change "causing a to vary" to --causing α to vary--
Column 20,   Line 6,     change "a temperature TO," to --a temperature T0,--

Signed and Sealed this
Twentieth Day of February, 2018

Andrei Iancu
*Director of the United States Patent and Trademark Office*